(12) United States Patent
Isobe et al.

(10) Patent No.: US 9,178,069 B2
(45) Date of Patent: Nov. 3, 2015

(54) SEMICONDUCTOR DEVICE AND SEMICONDUCTOR DEVICE PRODUCTION SYSTEM

(75) Inventors: Atsuo Isobe, Atsugi (JP); Shunpei Yamazaki, Setagaya (JP); Koji Dairiki, Tochigi (JP); Hiroshi Shibata, Higashine (JP); Chiho Kokubo, Tochigi (JP); Tatsuya Arao, Atsugi (JP); Masahiko Hayakawa, Atsugi (JP); Hidekazu Miyairi, Atsugi (JP); Akihisa Shimomura, Atsugi (JP); Koichiro Tanaka, Atsugi (JP); Mai Akiba, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 750 days.

(21) Appl. No.: 12/533,401

(22) Filed: Jul. 31, 2009

(65) Prior Publication Data

US 2010/0029068 A1 Feb. 4, 2010

Related U.S. Application Data

(60) Continuation of application No. 11/600,833, filed on Nov. 17, 2006, now Pat. No. 7,582,162, and a division of application No. 11/013,539, filed on Dec. 17, 2004, now Pat. No. 7,148,507, and a division of application No. 10/338,043, filed on Jan. 8, 2003, now Pat. No. 6,841,797.

(30) Foreign Application Priority Data

Jan. 17, 2002 (JP) ................................. 2002-009266

(51) Int. Cl.
*H01L 21/268* (2006.01)
*H01L 29/786* (2006.01)
(Continued)

(52) U.S. Cl.
CPC ...... *H01L 29/78603* (2013.01); *B23K 26/0738* (2013.01); *H01L 21/02354* (2013.01);
(Continued)

(58) Field of Classification Search
CPC .................. H01L 21/02675; H01L 21/32139; H01L 21/02354; H01L 21/2026; H01L 21/84; H01L 27/1214; H01L 27/1281; H01L 27/1296; H01L 29/78675; H01L 29/78696; Y10S 148/09; C30B 29/06; Y10T 117/10; Y10T 117/1008
USPC .......... 117/3, 4, 84, 88, 90, 97; 438/149, 154, 438/197, 378
See application file for complete search history.

(56) References Cited

U.S. PATENT DOCUMENTS

| 4,330,363 A | 5/1982 | Biegesen et al. |
| 4,710,604 A | 12/1987 | Shirasu et al. |

(Continued)

FOREIGN PATENT DOCUMENTS

| EP | 1 049 144 | 11/2000 | |
| EP | 1049144 A1 * | 11/2000 | ............. H01L 21/20 |

(Continued)

OTHER PUBLICATIONS

Geis et al., "Crystalline Silicon on Insulators by Graphoepitaxy," IEEE 1979, pp. 210-212.

(Continued)

*Primary Examiner* — Matthew Song
(74) *Attorney, Agent, or Firm* — Eric J. Robinson; Robinson Intellectual Property Law Office, P.C.

(57) ABSTRACT

A semiconductor device production system using a laser crystallization method is provided which can avoid forming grain boundaries in a channel formation region of a TFT, thereby preventing grain boundaries from lowering the mobility of the TFT greatly, from lowering ON current, and from increasing OFF current. Rectangular or stripe pattern depression and projection portions are formed on an insulating film. A semiconductor film is formed on the insulating film. The semiconductor film is irradiated with continuous wave laser light by running the laser light along the stripe pattern depression and projection portions of the insulating film or along the major or minor axis direction of the rectangle. Although continuous wave laser light is most preferred among laser light, it is also possible to use pulse oscillation laser light in irradiating the semiconductor film.

11 Claims, 35 Drawing Sheets

(51) Int. Cl.
*H01L 21/3213* (2006.01)
*H01L 21/02* (2006.01)
*B23K 26/073* (2006.01)
*H01L 21/20* (2006.01)
*H01L 21/84* (2006.01)
*H01L 29/66* (2006.01)
*H01L 27/12* (2006.01)

(52) U.S. Cl.
CPC .... *H01L21/02356* (2013.01); *H01L 21/02675* (2013.01); *H01L 21/2026* (2013.01); *H01L 21/32139* (2013.01); *H01L 21/84* (2013.01); *H01L 27/1281* (2013.01); *H01L 27/1296* (2013.01); *H01L 29/66757* (2013.01); *H01L 29/78675* (2013.01); *H01L 29/78696* (2013.01); *H01L 27/1214* (2013.01); *Y10S 118/90* (2013.01); *Y10T 117/10* (2015.01); *Y10T 117/1004* (2015.01); *Y10T 117/1008* (2015.01)

(56) References Cited

U.S. PATENT DOCUMENTS

| | | | |
|---|---|---|---|
| 5,097,297 A | 3/1992 | Nakazawa | |
| 5,145,808 A | 9/1992 | Sameshima et al. | |
| 5,163,220 A | 11/1992 | Zeto et al. | |
| 5,432,122 A | 7/1995 | Chae | |
| 5,529,951 A | 6/1996 | Noguchi et al. | |
| 5,578,897 A | 11/1996 | Nomura et al. | |
| 5,589,406 A | 12/1996 | Kato et al. | |
| 5,594,296 A | 1/1997 | Mitsutake et al. | |
| 5,636,042 A | 6/1997 | Nakamura et al. | |
| 5,643,826 A | 7/1997 | Ohtani et al. | |
| 5,659,329 A | 8/1997 | Yamanobe et al. | |
| 5,759,879 A | 6/1998 | Iwasaki | |
| 5,776,803 A | 7/1998 | Young | |
| 5,841,097 A | 11/1998 | Esaka et al. | |
| 5,847,780 A | 12/1998 | Kim et al. | |
| 5,851,862 A * | 12/1998 | Ohtani et al. | 438/166 |
| 5,854,803 A | 12/1998 | Yamazaki et al. | |
| 5,858,823 A | 1/1999 | Yamazaki et al. | |
| 5,893,948 A * | 4/1999 | Nickel et al. | 117/43 |
| 5,932,893 A | 8/1999 | Miyanaga et al. | |
| 5,953,597 A | 9/1999 | Kusumoto et al. | |
| 5,965,915 A | 10/1999 | Yamazaki et al. | |
| 5,970,368 A | 10/1999 | Sasaki et al. | |
| 5,981,974 A | 11/1999 | Makita | |
| 5,986,306 A | 11/1999 | Nakajima et al. | |
| 5,994,174 A | 11/1999 | Carey et al. | |
| 6,133,583 A | 10/2000 | Ohtani et al. | |
| 6,162,667 A | 12/2000 | Funai et al. | |
| 6,184,559 B1 | 2/2001 | Hayakawa et al. | |
| 6,210,996 B1 | 4/2001 | Yamazaki et al. | |
| 6,228,691 B1 * | 5/2001 | Doyle | 438/149 |
| 6,283,813 B1 | 9/2001 | Kaneko et al. | |
| 6,288,414 B1 | 9/2001 | Ahn | |
| 6,291,320 B1 | 9/2001 | Yamazaki et al. | |
| 6,307,214 B1 | 10/2001 | Ohtani et al. | |
| 6,337,259 B1 | 1/2002 | Ueda et al. | |
| 6,355,940 B1 | 3/2002 | Koga et al. | |
| 6,365,933 B1 | 4/2002 | Yamazaki et al. | |
| 6,372,562 B1 | 4/2002 | Matsumoto | |
| 6,387,779 B1 | 5/2002 | Yi et al. | |
| 6,388,386 B1 | 5/2002 | Kunii et al. | |
| 6,410,368 B1 | 6/2002 | Kawasaki et al. | |
| 6,424,331 B1 | 7/2002 | Ozawa | |
| 6,426,517 B2 | 7/2002 | Hayakawa et al. | |
| 6,429,100 B2 | 8/2002 | Yoneda | |
| 6,455,360 B1 | 9/2002 | Miyasaka | |
| 6,475,840 B1 | 11/2002 | Miyanaga et al. | |
| 6,482,721 B1 | 11/2002 | Lee | |
| 6,555,875 B2 | 4/2003 | Kawasaki et al. | |
| 6,566,179 B2 | 5/2003 | Murley et al. | |
| 6,583,440 B2 | 6/2003 | Yasukawa | |
| 6,602,744 B1 | 8/2003 | Ino et al. | |
| 6,602,758 B2 | 8/2003 | Kizilyalli et al. | |
| 6,632,696 B2 | 10/2003 | Kimura et al. | |
| 6,632,711 B2 | 10/2003 | Sugano et al. | |
| 6,653,212 B1 | 11/2003 | Yamanaka et al. | |
| 6,693,258 B2 | 2/2004 | Sugano et al. | |
| 6,700,133 B1 | 3/2004 | Ohtani et al. | |
| 6,727,122 B2 | 4/2004 | Seo et al. | |
| 6,747,289 B2 | 6/2004 | Yamazaki et al. | |
| 6,753,212 B2 | 6/2004 | Yamazaki et al. | |
| 6,759,628 B1 | 7/2004 | Ino et al. | |
| 6,797,550 B2 | 9/2004 | Kokubo et al. | |
| 6,812,491 B2 | 11/2004 | Kato et al. | |
| 6,841,434 B2 | 1/2005 | Miyairi et al. | |
| 6,847,050 B2 | 1/2005 | Yamazaki et al. | |
| 6,861,614 B1 | 3/2005 | Tanabe et al. | |
| 6,862,008 B2 | 3/2005 | Yamazaki et al. | |
| 6,875,998 B2 | 4/2005 | Kato et al. | |
| 6,884,668 B2 | 4/2005 | Yamazaki et al. | |
| 6,894,674 B2 | 5/2005 | Nakajima et al. | |
| 6,906,343 B2 | 6/2005 | Yamazaki | |
| 6,911,358 B2 | 6/2005 | Azami et al. | |
| 6,911,698 B2 | 6/2005 | Yamazaki et al. | |
| 6,913,956 B2 | 7/2005 | Hamada et al. | |
| 6,930,326 B2 | 8/2005 | Kato et al. | |
| 6,933,527 B2 | 8/2005 | Isobe et al. | |
| 6,943,760 B2 | 9/2005 | Bae et al. | |
| 6,974,731 B2 | 12/2005 | Yamazaki et al. | |
| 7,015,882 B2 | 3/2006 | Yumoto | |
| 7,084,016 B1 | 8/2006 | Yamazaki et al. | |
| 7,105,392 B2 | 9/2006 | Isobe et al. | |
| 7,115,453 B2 | 10/2006 | Nakamura et al. | |
| 7,115,903 B2 | 10/2006 | Isobe et al. | |
| 7,129,121 B2 | 10/2006 | Azami et al. | |
| 7,129,122 B2 * | 10/2006 | Kato et al. | 438/151 |
| 7,135,389 B2 | 11/2006 | Yamazaki et al. | |
| 7,145,175 B2 | 12/2006 | Kato et al. | |
| 7,148,092 B2 | 12/2006 | Isobe et al. | |
| 7,166,863 B2 | 1/2007 | Yamazaki et al. | |
| 7,176,490 B2 | 2/2007 | Isobe et al. | |
| 7,179,699 B2 | 2/2007 | Miyairi et al. | |
| 7,192,813 B2 | 3/2007 | Yamazaki et al. | |
| 7,214,573 B2 | 5/2007 | Yamazaki et al. | |
| 7,226,817 B2 | 6/2007 | Tanada et al. | |
| 7,282,398 B2 | 10/2007 | Yamazaki et al. | |
| 7,312,473 B2 | 12/2007 | Koyama et al. | |
| 7,319,055 B2 | 1/2008 | Kokubo et al. | |
| 7,344,925 B2 * | 3/2008 | Kato et al. | 438/149 |
| 7,541,228 B2 * | 6/2009 | Kato et al. | 438/149 |
| 7,619,253 B2 | 11/2009 | Yamazaki et al. | |
| 2001/0041392 A1 * | 11/2001 | Suzawa et al. | 438/149 |
| 2002/0119609 A1 | 8/2002 | Hatano et al. | |
| 2002/0192956 A1 * | 12/2002 | Kizilyalli et al. | 438/689 |
| 2003/0022471 A1 * | 1/2003 | Taketomi et al. | 438/496 |
| 2003/0181043 A1 | 9/2003 | Tanada et al. | |
| 2003/0209710 A1 | 11/2003 | Yamazaki et al. | |
| 2003/0218171 A1 | 11/2003 | Isobe et al. | |
| 2004/0026696 A1 | 2/2004 | Yamazaki et al. | |
| 2007/0004104 A1 | 1/2007 | Azami et al. | |
| 2007/0034877 A1 | 2/2007 | Isobe et al. | |
| 2007/0120127 A1 | 5/2007 | Isobe et al. | |
| 2007/0190810 A1 | 8/2007 | Yamazaki et al. | |

FOREIGN PATENT DOCUMENTS

| | | |
|---|---|---|
| EP | 1 067 593 | 1/2001 |
| JP | 62-104117 | 5/1987 |
| JP | 63-031108 | 2/1988 |
| JP | 06-349735 | 12/1994 |
| JP | 07-130652 | 5/1995 |
| JP | 07-249779 | 9/1995 |
| JP | 08-070129 | 3/1996 |
| JP | 08-078329 | 3/1996 |
| JP | 08-195357 | 7/1996 |
| JP | 08-288515 | 11/1996 |
| JP | 10-012891 | 1/1998 |
| JP | 10-135468 | 5/1998 |
| JP | 10-135469 | 5/1998 |
| JP | 11-084418 | 3/1999 |
| JP | 11-354442 | 12/1999 |

(56) References Cited

FOREIGN PATENT DOCUMENTS

| | | |
|---|---|---|
| JP | 2000-068520 | 3/2000 |
| JP | 2000-277450 | 10/2000 |
| JP | 2000-349296 | 12/2000 |
| JP | 2001-011085 | 1/2001 |
| JP | 2001-035790 | 2/2001 |
| JP | 2001-144027 | 5/2001 |
| JP | 2001-196599 | 7/2001 |
| JP | 2001-319877 | 11/2001 |
| JP | 2002-014337 | 1/2002 |
| JP | 2002-313811 | 10/2002 |
| JP | 2002-324808 | 11/2002 |
| WO | 00/63956 | 10/2000 |

OTHER PUBLICATIONS

Geis et al., "Grapho-epitaxy of Silicon on Fused Silica Using Surface Micropatterns and Laser Crystallization," J. Vac. Sci. Tech., 16(6), Nov./Dec. 1979, pp. 1640-1643.

Lam et al., "Characteristics of MOSFETS Fabricated in Laser-Recrystallized Polysilicon Islands with a Retaining Wall Structure on an Insulating Substrate," IEEE Electron Device Letters, vol. EDL-1, No. 10, 1980, pp. 206-208.

Smith et al., "Oriented Crystal Growth on Amorphous Substrates Using Artificial Surface-Relief Gratings," Applied Physics Letters 32(6), 1978, pp. 349-350.

Biegelsen et al., "Laser-induced Crystallization of Silicon Islands on Amorphous Substrates: Multilayer Structures," Applied Physics Letters 38(3), 1981, pp. 150-152.

A. Hara et al., *Ultra-High Performance Poly-Si TFTs on a Glass by a Stable Scanning CW Laser Lateral Crystallization*, AM-LCD '01 Digest of Technical Papers, Jan. 1, 2001, p. 227-230.

M.W. Geis, *Crystallographic Orientation of Silicon on an Amorphous Substrate Using an Artificial Surface-Relief Grating and Laser Crystallization*, Applied Physics Letters, vol. 35, No. 1, Jul. 1, 1979, pp. 71-74.

M.A. Baldo, et al., *Very High-Efficiency Green Organic Light-Emitting Devices Based on Electrophosphorescence*, Applied Physics Letters, vol. 75, No. 1, Jul. 5, 1999, pp. 4-6.

T. Tsutsui, at al., *High Quantum Efficiency in Organic Light-Emitting Devices with Iridium-Complex as a Triplet Emissive Center*, Japanese Journal of Applied Physics, vol. 38, Part 2,. No. 12B, Dec. 15, 1999, pp. L1502-L1504.

M.A. Baldo et al., *Highly Efficient Phosphorescent Emission from Organic Electroluminescent Devices*, Nature, vol. 395, Sep. 10, 1998, pp. 151-154.

T. Tsutsui et al., *Electroluminescence in Organic Thin Films*, Photochemical Processes in Organized Molecular Systems, Sep. 22, 1990, pp. 437-450.

M. Kishino et al., *Physics of VLSI Device*, Jan. 1, 1995, pp. 144-146.

* cited by examiner 172  170  171

180  181

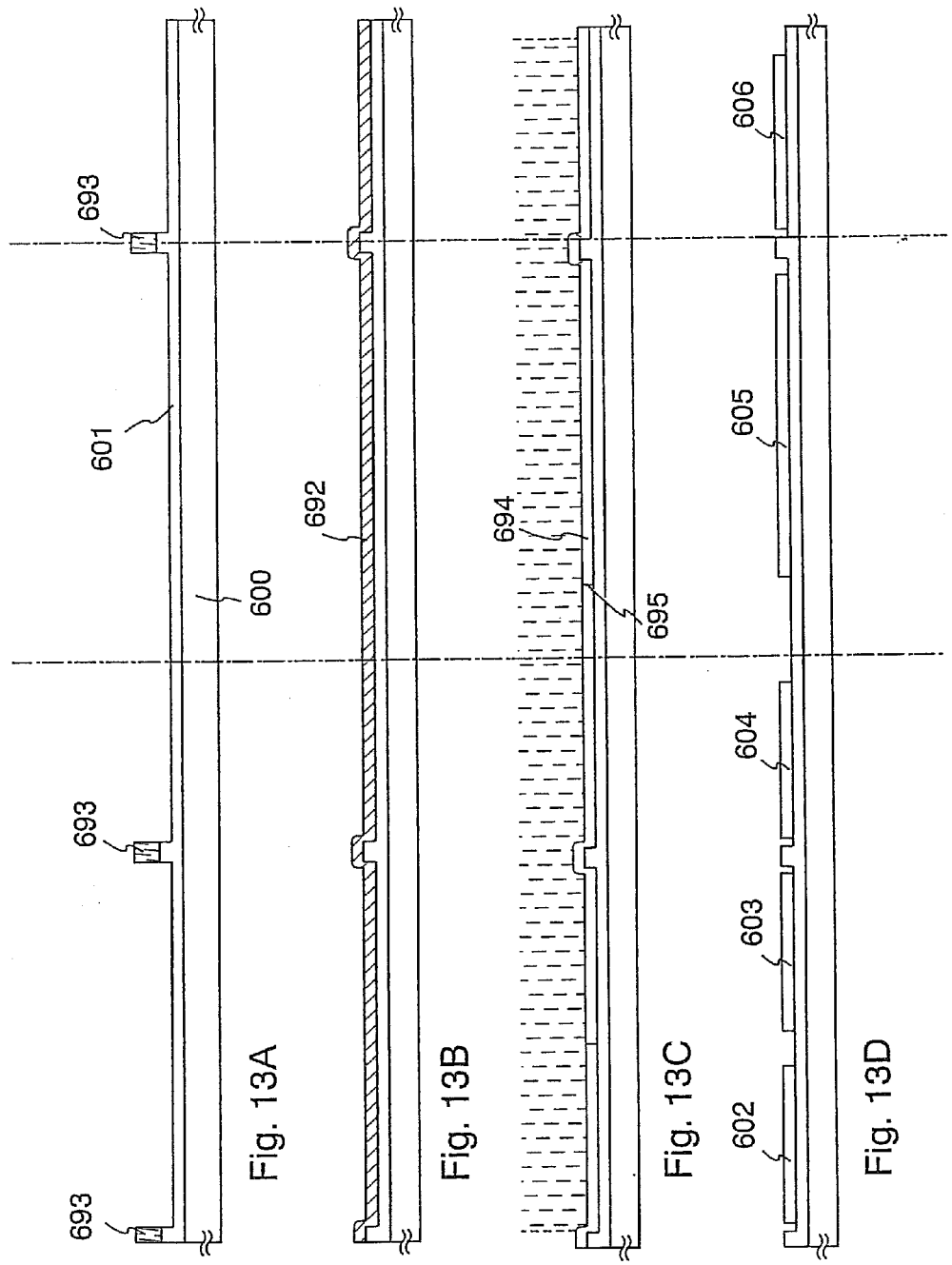

SEMICONDUCTOR DEVICE AND SEMICONDUCTOR DEVICE PRODUCTION SYSTEM

This application is a continuation of application Ser. No. 11/600,833, filed Nov. 17, 2006, now U.S. Pat. No. 7,582,162, which is a divisional of application Ser. No. 11/013,539, filed Dec. 17, 2004, now U.S. Pat. No. 7,148,507, which is a divisional of application Ser. No. 10/338,043, filed Jan. 8, 2003, now U.S. Pat. No. 6,841,797.

BACKGROUND OF THE INVENTION

1. Field of the Invention

The present invention relates to a semiconductor device constructed by a semiconductor film that has a crystal structure, and more specifically, to a semiconductor device using a thin film transistor whose active layer is formed of a crystalline semiconductor film obtained through crystal growth on an insulating surface. The present invention also relates to a semiconductor device product ion system using laser light.

2. Description of the Related Art

In recent years, techniques for forming TFTs on a substrate have made great advancements and applications of TFTs to active matrix type semiconductor display devices are being developed. In particular, TFTs formed of polycrystalline semiconductor films (hereinafter referred to as polysilicon TFT) have higher field effect mobility (also referred to as mobility) than conventional TFTs that use amorphous semiconductor films, and accordingly can operate at high speed. Therefore pixels can be controlled by a driving circuit formed on the same substrate on which the pixels are formed, instead of a driving circuit external to the substrate as with the conventional technique.

Incidentally, for substrates used in semiconductor devices, a glass substrate is deemed more promising than a single crystal silicon substrate cost-wise. Glass substrates have poor heat-resistance and are easily deformed by heat. Therefore, when forming a polysilicon TFT on a glass substrate, using laser annealing to crystallize a semiconductor film in order to avoid thermal deformation of the glass substrate is extremely effective.

Laser annealing has characteristics such as remarkable reduction of processing time compared to an annealing method utilizing radiant heating or thermal conductive heating, and a semiconductor or a semiconductor film is selectively and locally heated so that a substrate is scarcely thermally damaged.

Note that the term "laser annealing" herein indicates a technique for recrystallizing a damaged layer formed on a semiconductor substrate or in a semiconductor film and a technique for crystallizing a semiconductor film formed on a substrate. The term "laser annealing" also includes a technique that is applied to leveling or improvement of a surface quality of the semiconductor substrate or the semiconductor film. Applicable laser oscillation devices are gas laser oscillation devices represented by an excimer laser, and solid laser oscillation devices represented by a YAG laser. Such laser oscillation devices are known to heat a surface layer of a semiconductor by laser beam irradiation for an extremely short period of time, i.e., about several tens of nanoseconds to several tens of microseconds so as to crystallize the surface layer.

Lasers are roughly divided into two types, pulse oscillation and continuous wave, by their oscillation methods. Pulse oscillation lasers are relatively high in output energy and therefore the size of laser beam can be set to several cm$^2$ to increase the mass-productivity. In particular, if the shape of laser beam is processed by an optical system into a linear shape 10 cm or more in length, a substrate can be irradiated with the laser light efficiently to increase the mass-productivity even more. Accordingly, using pulse oscillation lasers to crystallize semiconductor films have been becoming mainstream.

In recent years, however, it has been found that the grain size of crystals formed in a semiconductor film is larger when a continuous wave laser is used to crystallize a semiconductor film than when a pulse oscillation laser is used. With crystals of larger grain size in a semiconductor film, the mobility of TFTs formed from this semiconductor film is increased while fluctuation in characteristics between the TFTs due to grain boundaries is reduced. As a result, continuous wave lasers are now suddenly attracting attention.

Trying to form a single crystal semiconductor film on an insulating surface is not new and a technique called graphoepitaxy has been devised as a more positive attempt. Graphoepitaxy is a technique in which a level difference is formed on a surface of a quartz substrate, an amorphous semiconductor film or a polycrystalline semiconductor film is formed on the substrate, and the film is heated by a laser beam or a heater so that an epitaxial growth layer is formed with the level difference on the quartz substrate as the nucleus. This technique is disclosed in, for example, Non-patent Literature 1.

[Non-Patent Literature 1]

J. Vac. Sci. Technol., "Grapho-epitaxy of silicon on fused silica using surface micropatterns and laser crystallization", 16(6), 1979, pp. 1640-1643.

Another semiconductor film crystallizing technique called graphoepitaxy is disclosed in, for example, Non-patent Literature 2. The literature is about inducing epitaxial growth of a semiconductor film by artificially-created surface relief grating on an amorphous substrate. According to the graphoepitaxy technique disclosed in Non-patent Literature 2, a level difference is formed on a surface of an insulating film, a semiconductor film is formed on the insulating film, and the semiconductor film is subjected to heating, laser light irradiation, or the like to start epitaxial growth of crystals of the semiconductor film.

[Non-Patent Literature 2]

M. W. Geis, et al., "CRYSTALLINE SILICON ON INSULATORS BY GRAPHOEPITAXY", Technical Digest of International Electron Devices Meeting, 1979, p. 210.

Crystalline semiconductor films formed using laser annealing methods, which are roughly classified into pulse oscillation and continuous wave, are masses of crystal grains in general. These crystal grains have varying sizes and are positioned at random, and it is difficult to specify the position and size of crystal grains in forming a crystalline semiconductor film. Therefore an active layer formed by patterning the crystalline semiconductor film into islands generally have interface between crystal grains (grain boundaries).

Unlike the inside of a crystal grain, a grain boundary has an infinite number of re-combination centers and trap centers due to an amorphous structure and crystal defects. When carriers are trapped in these trap centers, the potential of the grain boundary rises to block carriers and lower the current carrying characteristic of carriers. Therefore, grain boundaries in an active layer, in particular, in a channel formation region of a TFT, seriously affect TFT characteristics by lowering the mobility of the TFT greatly, by lowering ON current, and by increasing OFF current since a current flows in grain boundaries. Grain boundaries also cause fluctuation in characteristic among TFTs that are intended to have the same characteristic because the characteristic of a TFT having grain boundaries in its active layer is different from that of a TFT whose active layer has no grain boundaries.

Crystal grains obtained by irradiating a semiconductor film with laser light have varying sizes and are positioned randomly because of the following reason. It takes time for a liquefied semiconductor film that has been thoroughly melted by laser light irradiation to create a solid nucleus. As time passes, an infinite number of crystal nuclei are generated in the thoroughly melted region and crystals grow from the crystal nuclei. Since positions of the crystal nuclei to be generated are at random, they are distributed unevenly. Crystal growth is stopped as crystal grains collide against each other. Accordingly, the crystal grains obtained have varying sizes and are positioned at random.

Ideally, a channel formation region, which has a great influence over TFT characteristics, is formed from a single crystal grain removing adverse effect of grain boundaries. However, prior art is mostly unsuccessful in forming a crystalline silicon film with no grain boundaries by laser annealing. Therefore no TFT whose active layer is formed of a crystalline silicon film crystallized by laser annealing has succeeded in obtaining characteristics that rival the characteristics of a MOS transistor manufactured on a single crystal silicon substrate.

SUMMARY OF THE INVENTION

The present invention has been made in view of the above-mentioned problems, and an object of the present invention is therefore to provide a semiconductor device production system using a laser crystallization method which can avoid forming grain boundaries in a channel formation region of a TFT, thereby preventing grain boundaries from lowering the mobility of the TFT greatly, from lowering ON current, and from increasing OFF current.

The inventors of the present invention have found that, when a semiconductor film is formed on an insulating film having depression and projection portions and is irradiated with laser light, crystal nuclei are generated in the vicinity of edges of the depression bottom or projection top of the insulating film and crystal growth starts from the crystal nuclei and proceeds in the direction parallel to the insulating film. A depression portion refers to a dented region where no projection portion is formed.

This mechanism is explained with reference to FIGS. 1A and 1B. FIG. 1A shows a semiconductor film 11 formed on an insulating film 10 that has a projection portion 10a. The semiconductor film 11 is melted by laser light irradiation and the heat in the semiconductor film 11 is released to the insulating film 10. The heat radiation is efficient where a large area of the semiconductor film is in contact with the insulating film. For instance, in FIG. 1A, the heat is released to the insulating film more efficiently and crystal nuclei are formed faster in portions 14 and 15 where the semiconductor film 11 and the insulating film 10 meet on two planes that intersect with each other than in portions 12 and 13 where the semiconductor film 11 and the insulating film 10 meet on one plane. Also, the heat radiation is efficient in a portion of the insulating film that has a large heat capacitance. For example, the portion 14, which is in the vicinity of the edge of the depression portion, is larger in volume of the insulating film within a certain range and accordingly has larger heat capacitance than the portion 15, which is in the vicinity of the edge of the projection portion. Therefore released heat does not stay long in the portion 14 and heat radiation is more efficient in the portion 14 than in the portion 15. As a result, crystal nuclei are formed faster in the portion 14 which is near the edge of the depression portion than in the portion 15 which is near the edge of the projection portion.

As time passes, crystal growth starts from the crystal nuclei formed in the portion 14 near the edge of the depression portion and proceeds in the direction parallel to the insulating film. Crystal growth directions in a semiconductor film will be described with reference to FIG. 1B. FIG. 1B shows a semiconductor film 11 formed on an insulating film 10 that has two projection portions 10a and 10b. In the semiconductor film 11, crystal growth starts from a portion 14 near an edge of a depression portion and proceeds in the upper and lateral directions indicated by arrows. The crystal growth started from the portion 14 toward lateral direction near an edge of a depression portion comes to an end as it meets crystal growth started from an edge of the adjacent depression portion 14 halfway, thereby forming a grain boundary 16.

As described above, crystallization by laser light irradiation of an insulating film that has a projection portion makes it possible to control the position at which a grain boundary is formed to a certain degree. This gives foresight of where grain boundaries are formed in the semiconductor film at the stage of designing the shape of the insulating film. In other words, the present invention can choose where grain boundaries are to be formed and this makes it possible to place a channel formation region, preferably an active layer, such that the active layer or channel formation region includes as few grain boundaries as possible.

Specifically, the insulating film is given rectangular or stripe pattern depression and projection portions. Then a semiconductor film is formed on the insulating film and is irradiated with continuous wave laser light along the stripe pattern depression and projection portions of the insulating film or along the major or minor axis direction of the rectangular. Although continuous wave laser light is most preferred among laser light, it is also possible to use pulse oscillation laser light in irradiating the semiconductor film. The projection portion in section in the direction perpendicular to the laser light scanning direction may be rectangular, triangular, or trapezoidal.

A grain boundary is formed in the semiconductor film about the midpoint between edges of adjacent projection portions and another grain boundary is formed in the semiconductor film about the midpoint between edges of a depression portion. These grain boundaries are formed by collision between growing crystals. Accordingly, the present invention uses as a channel formation region a portion 17 between one edge of a depression portion and the midpoint between the one edge and the other edge of the depression portion, where fewer grain boundaries are formed to give the portion excellent crystallinity. A portion 18, which is between one edge of a projection portion and the midpoint between the one edge and the other edge of the projection portion, has fewer grain boundaries to give the portion excellent crystallinity and can also be used as an active layer or a channel formation region. It is not that the excellent crystallinity portions 17 and 18 have no grain boundaries. However, the portions 17 and 18 have better crystallinity even if they have grain boundaries because their crystal grains are large in size.

In the present invention, a semiconductor film crystallized by laser light is patterned to remove a portion of the film around the midpoint between edges of a depression portion or projection portion. The remaining portion between one edge of a depression portion or projection portion and the midpoint between the one edge and the other edge of the depression portion or projection portion, which has fewer grain boundaries and therefore has excellent crystallinity, is used as an active layer of a TFT. This makes it possible to avoid forming a grain boundary in a channel formation region of a TFT, thereby preventing grain boundaries from lowering the mobility of the TFT greatly, from lowering ON current, and from increasing OFF current. How far from an edge of a depression portion or projection portion is to be removed by patterning can be decided at designer's discretion In general, laser beam edges and the vicinity thereof are lower in energy density than the center of the laser beam and a semiconductor film irradiated with laser beam edges often has poor crystallinity. It is therefore desirable at the time of laser light scanning to prevent edges of laser light track from overlapping a portion that later serves as a channel formation region of a TFT.

To achieve this, a semiconductor device production system of the present invention first stores data of the shape of the insulating film or semiconductor film viewed from above the substrate (pattern information) as the data is obtained in the design stage. From the pattern information and the width of a laser beam in the direction perpendicular to the laser light scanning direction, the laser light scanning path is determined so that edges of the laser light track is prevented from overlapping at least a portion that serves as a channel formation region of a TFT. Then the substrate is positioned with a marker as the reference and the semiconductor film on the substrate is irradiated with laser light by running it along the scanning path determined.

The above-mentioned structure makes it possible to at least run laser light over only portions that need laser light irradiation, instead of irradiating the entire substrate with laser light. Therefore time for laser irradiation of portions that do not need laser light irradiation can be saved to shorten the whole laser irradiation time and improve the substrate processing speed. The above-mentioned structure also makes it possible to avoid damage to a substrate which is caused by irradiating a portion that does not need laser irradiation with laser light.

The marker may be formed by directly etching the substrate with laser light or the like, or may be formed in a part of the insulating film having depression and projection portions at the same time the insulating film is formed. Another method of positioning the substrate is to use an image pickup device such as a CCD to read the shape of the insulating film or semiconductor film actually formed, then store it as data in the first storing means, store in the second storing means the insulating film or semiconductor film pattern information obtained in the design stage, and check the data stored in the first storing means against the pattern information stored in the second storing means.

By forming a marker in a part of the insulating film or by using the shape of the insulating film as a marker, one fewer marker mask is needed and the marker can be formed and positioned more accurately than when forming it on a substrate by laser light. As a result, the positioning accuracy is improved.

In general, the energy density of laser light is not thoroughly uniform and is varied between different points in a laser beam. The present invention requires to irradiate at least an area that serves as a channel formation region, preferably the entire flat face of a depression portion or the entire flat face of a projection portion, with laser light having a constant energy density. Therefore, it is necessary in the present invention to use a laser beam having such an energy density distribution that makes a region of the laser beam that has uniform energy density completely overlap at least an area that serves as a channel formation region, preferably the entire flat face of a depression portion or the entire flat face of a projection portion, during laser light scanning. A shape desirable for a laser beam to meet the above-mentioned energy density condition would be rectangular, linear, etc.

A slit may be used to cut off a portion of a laser beam that is low in energy density. The use of a slit makes uniform crystallization possible by irradiating the entire flat face of a depression portion or the entire flat face of a projection portion with laser light that has relatively uniform energy density. In addition, the use of a slit allows a laser beam to partially change its width in accordance with the insulating film or semiconductor film pattern information. This reduces limitations in layout of a channel formation region or active layer of a TFT. The laser beam width here means the length of a laser beam in the direction perpendicular to the scanning direction.

One laser beam obtained by synthesizing laser beams that are emitted from plural laser oscillators may be used in laser crystallization. This structure allows low energy density portions of laser beams to supplement one another.

After the semiconductor film is formed, the semiconductor film may be crystallized by laser light irradiation without exposing the film to the air (for example, noble gas, nitrogen, oxygen, or other specific gas atmosphere or a reduced pressure atmosphere is employed). This structure can prevent molecule-level contaminants in a clean room, such as boron contained in a filter for enhancing the cleanliness of the air, from mixing in the semiconductor film during laser light crystallization.

A conventional semiconductor film crystallization technique called graphoepitaxy is to induce epitaxial growth of a semiconductor film by artificially-created surface relief grating on an amorphous substrate. Graphoepitaxy-relating techniques are described in Non-patent Literature 2 given in the above and others. The paper discloses that a graphoepitaxy technique is for forming a level difference on a surface of an insulating film, forming a semiconductor film on the insulating film, and subjecting the semiconductor film to treatment such as heating or laser light irradiation for epitaxial growth of crystals in the semiconductor film. As the temperature required for epitaxial growth is 700° C. or higher a glass substrate can not be used due to poor heat resisting properties. Even when epitaxial growth is attempted using a quartz substrate, a grain boundary is formed in the semiconductor film near center of a depression portion or projection portion of the insulating film. In the present invention, the crystallinity of an area to form an island is improved by placing a mask for the island, so that layout of the island dictates the shape of a depression portion or projection portion of the insulating film and the position of an edge of a depression portion or projection portion. Specifically, the shape, size, and the like of a depression portion or projection portion are determined such that an island does not overlap an edge of the depression portion or projection portion or the midpoint between the edges of the depression portion or projection portion. Using the insulating film designed in accordance with the layout of the island, the position of a grain boundary is selectively set. A portion of the semiconductor film where a grain boundary is selectively formed is removed by patterning and the remaining portion, which has relatively good crystallinity, is used as the channel formation region. The technique disclosed in the present invention is similar to conventional graphoepitaxy in that a semiconductor film is formed on an insulating film having a level difference and the level difference is used to crystallize the semiconductor film. However, conventional graphoepitaxy does not include using the level difference to control the position of a grain boundary and reduce grain boundaries in number in an island, and therefore is not identical with the present invention despite the resemblance.

BRIEF DESCRIPTION OF THE DRAWINGS

In the accompanying drawings:

FIGS. 13A to 13D are diagrams showing a method of manufacturing a semiconductor device using the present invention;

DETAILED DESCRIPTION OF THE PREFERRED EMBODIMENTS

A laser light irradiation method used in the present invention will be described with reference to FIGS. 2A to 2C.

Figure 1A:
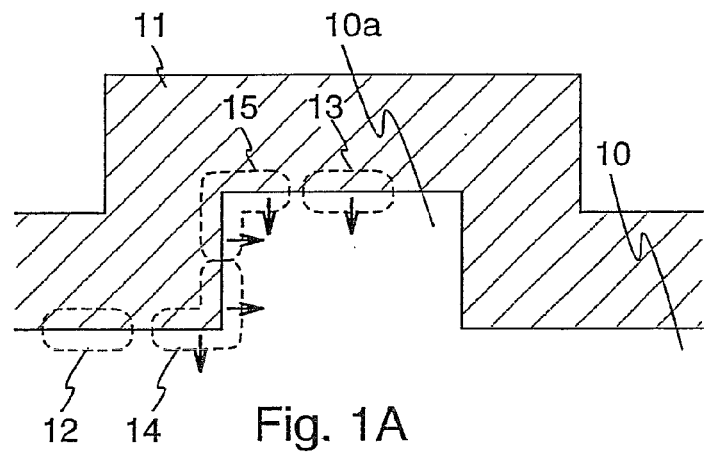
FIGS. 1A and 1B are diagrams showing crystal growth directions in a semiconductor film when irradiated with laser light.
Figure 1B:
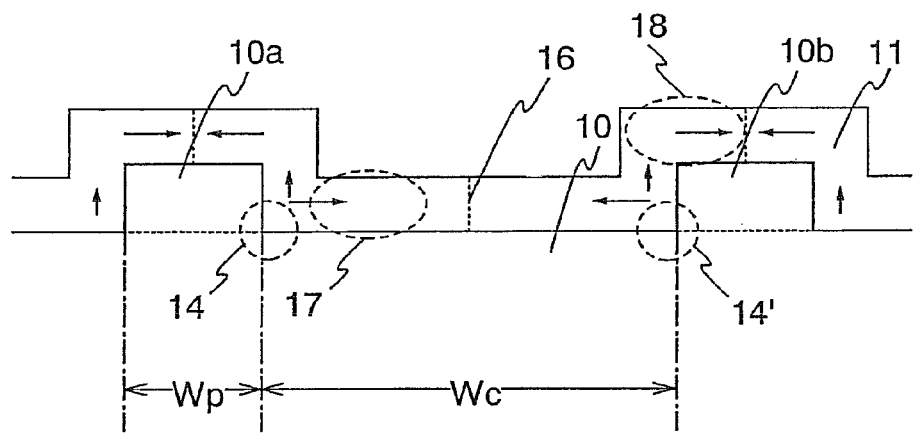
Figure 2A:
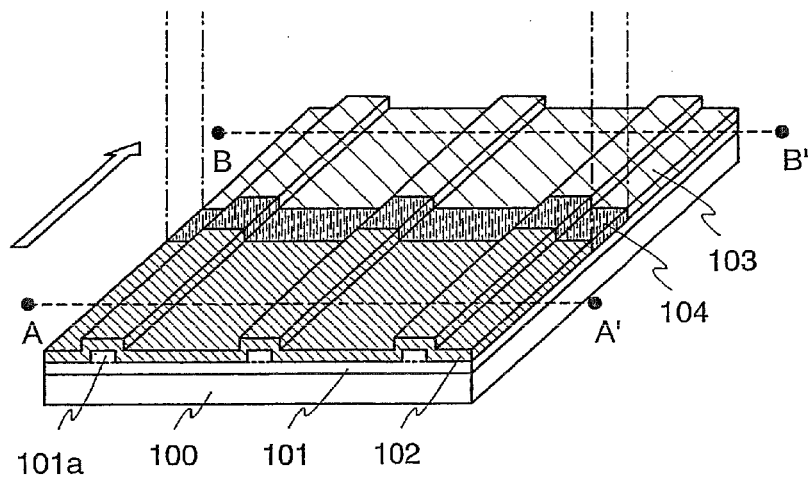
FIGS. 2A to 2C are diagrams showing a semiconductor film being irradiated with laser light.

First, an insulating film 101 is formed on a substrate 100 as shown in FIG. 2A. The insulating film 101 has projection portions 101a forming a stripe pattern. How the insulating film is given depression and projection will be described later in detail. The insulating film 101 is a silicon oxide film, a silicon oxynitride film, a silicon nitride film, or the like. Other insulating films can be used as long as they are insulating films which can prevent an alkaline metal or other impurities from entering a semiconductor film subsequently formed, which have enough heat resistance to withstand the temperature in subsequent treatment, and which can have depression and projection. The insulating film 101 may also be a laminate of two or more films.

A marker may be formed from a part of the insulating film 101 at the same time the insulating film 101 is formed.

The material of the substrate 100 has to have enough heat resistance to withstand the temperature in subsequent treatment. For example, a quartz substrate, silicon substrate, glass substrate, metal substrate, or stainless steel substrate with an insulating film formed on its surface is used as the substrate 100. The glass substrate is formed of barium borosilicate glass, alumino-borosilicate glass, or the like. A plastic substrate may also be used if it has enough heat resistance to withstand the temperature in subsequent treatment.

Next, a semiconductor film 102 is formed to cover the insulating film 101. The semiconductor film 102 can be formed by a known method (sputtering, LPCVD, plasma CVD, or the like). The semiconductor film may be an amorphous semiconductor film, a microcrystalline semiconductor film, or a crystalline semiconductor film. The semiconductor film may also be formed of silicon or silicon germanium.

The semiconductor film 102 also has depression and projection along the depression and projection of the insulating film 101. The size of the projection portions 101a of the insulating film 101 can be set at designer's discretion but the projection portions have to be thick enough to avoid discontinuity in the subsequently-formed semiconductor film near edges of the projection portions. If an active layer is placed in a depression portion, restrictions in layout of an active layer can be reduced by setting the depression portion wider than the projection portion. If an active layer is placed in a projection portion, restrictions in layout of an active layer can be reduced by setting the projection portion wider than the depression portion. In this embodiment, the flat portion of a depression portion is twice wider than the flat portion of a projection portion or more and the width of a projection portion is set to 300 to 3000 nm. The height of a projection portion is set to 30 to 300 nm.

Next, the semiconductor film 102 is irradiated with laser light as shown in FIG. 2A to form a semiconductor film (post-LC) 103 with improved crystallinity. The laser light energy density is low in the vicinity of the edges of a laser beam 104. Therefore a film irradiated with the laser beam edges has small crystal grains and a ridge is formed protruding along a grain boundary. Therefore, the edges of the track of the laser beam 104 is prevented from overlapping a portion to serve as a channel formation region.

The laser light scanning direction is set parallel to the direction of the projection portions 101a as indicated by the arrow.

The present invention can employ known lasers. Continuous wave laser light is desirable but it is considered that pulse oscillation laser light can also provide the effect of the present invention to a certain degree. A gas laser or solid-state laser can be employed. Examples of the gas laser include an excimer laser, an Ar laser, and a Kr laser. Examples of the solid-state laser include a YAG laser, a $YVO_4$ laser, a YLF laser, a $YAlO_3$ laser, a glass laser, a ruby laser, an alexandrite laser, a Ti:sapphire laser, and a $Y_2O_3$ laser. The solid-state laser employed is a laser that uses crystals of YAG, $YVO_4$, YLF, $YAlO_3$ or the like doped with Cr, Nd, Er, Ho, Ce, Co, Ti, Yb, or Tm. The fundamental wave of the laser is varied depending on the material used for doping, but laser light obtained has a fundamental wave of about 1 μm. A non-linear optical element is used to obtain harmonic of the fundamental wave.

Ultraviolet laser light may also be employed. The ultraviolet laser light is obtained by using a non-linear optical element to convert infrared laser light that is emitted from a solid-state laser into green laser light and then using another non-linear optical element to convert the green laser light.

Figure 2B:
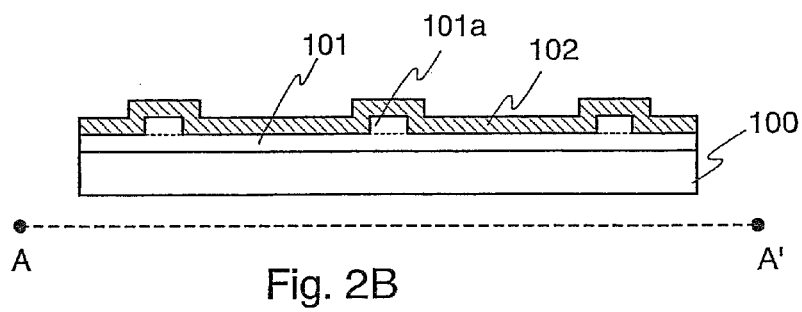
Figure 2C:
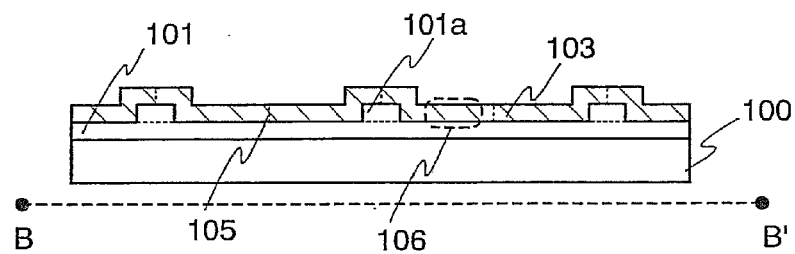

FIG. 2B corresponds to a sectional view taken along the line A-A' of FIG. 2A before crystallization and FIG. 2C is a sectional view taken along the line B-B' after crystallization. In the semiconductor film (post-LC) 103 crystallized by laser light irradiation, a grain boundary 105 is easily formed around the center of a depression portion of the insulating film 101. Used in FIGS. 2A to 2C as an active layer or a channel formation region is a portion 106 between one edge of a depression portion and the midpoint between the one edge and the other edge of the depression portion, where fewer grain boundaries are formed to give the portion excellent crystallinity. It is not that the excellent crystallinity portion 106 has no grain boundaries. However, the portion 106 has better crystallinity even if it has grain boundaries because its crystal grains are large in size. A portion between one edge of a projection portion and the midpoint between the one edge and the other edge of the projection portion has fewer grain boundaries to give the portion excellent crystallinity, and this portion too can be used as an active layer or a channel formation region.

Figure 3A:
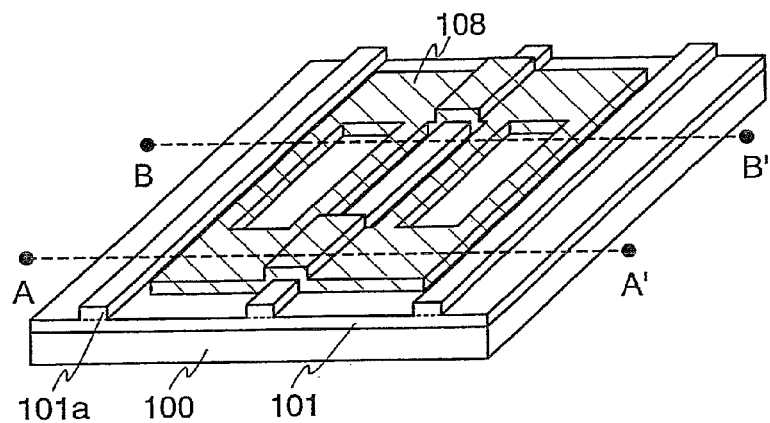
FIGS. 3A to 3C are diagrams of islands formed by patterning a crystallized semiconductor film.

The semiconductor film 103 after crystallization is then patterned as shown in FIG. 3A, avoiding the semiconductor film around the midpoint between edges of a depression portion and near a projection portion where many grain boundaries are supposedly formed to be used as channel formation regions. The remaining portion, between one edge of a depression portion and the midpoint between the one edge and the other edge of the depression portion, has excellent crystallinity and is used to form channel formation regions.

Figure 3B:
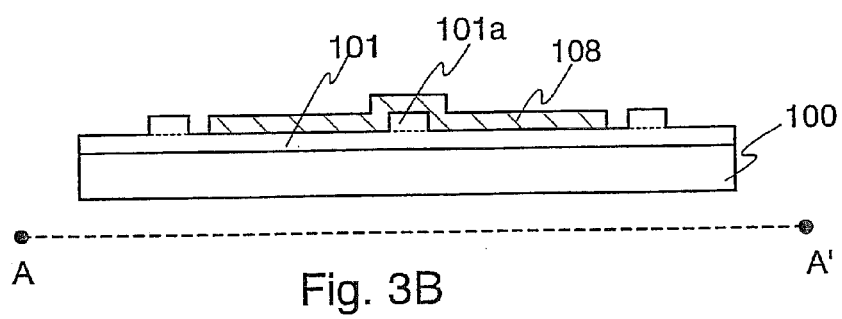
Figure 3C:
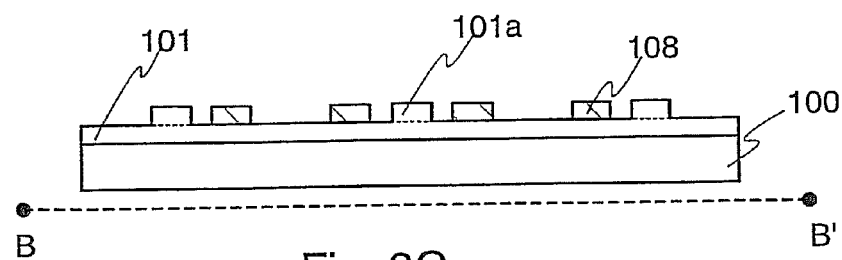

In this embodiment, the semiconductor film 103 is patterned so as to partially leave regions near edges of projection portions or regions near edges of depression portions, projection portions, and regions around the centers of depression portions. Thus obtained is the island 108 in which only channel formation regions are separated as shown in FIG. 3A and which is used as a slit-like active layer. A sectional view taken along the line A-A' of the island 108 is shown in FIG. 3B and FIG. 3C is a sectional view taken along the line B-B' of the island 108. In a portion to serve as a source region or a drain region, the crystallinity of a semiconductor film has less influence over TFT characteristics than in a channel formation region. Therefore using as a source region or a drain region a portion of a semiconductor film that has rather poor crystallinity does not present a problem.

Figure 4A:
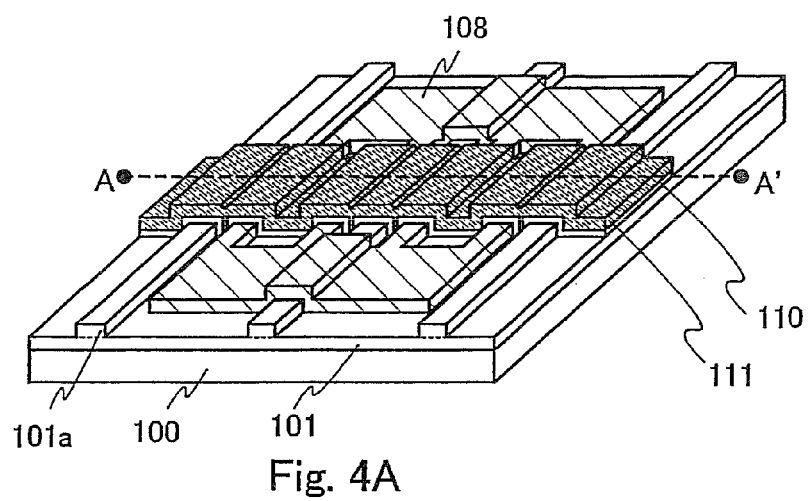
FIGS. 4A and 4B are diagrams showing the structure of a TFT that is formed from the islands shown in FIGS. 3A to 3C.

Next, a gate insulating film 110 is formed as shown in FIG. 4A to cover at least a portion of the island 108 that serves as a channel formation region. Although a portion to serve as a source region or a drain region is exposed in FIG. 4A, the gate insulating film 110 may cover the entire island 108.

Figure 4B:
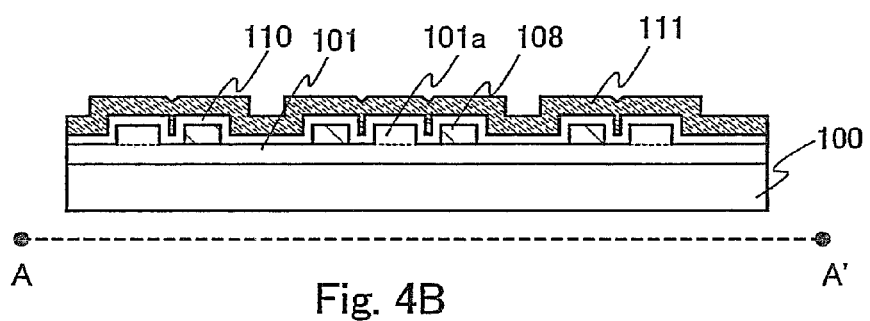

Then a conductive film is formed and patterned to form a gate electrode 111. A sectional view taken along the line A-A' in FIG. 4A is shown in FIG. 4B. The gate electrode 111 overlaps every channel formation region.

Through the above-mentioned manufacturing process, a TFT having channel formation regions separated from one another is completed. This structure makes it possible to increase the channel width in a channel formation region so that the TFT can be driven while ensuring ON current. As a result, the heat generated can be released efficiently.

Figure 5:
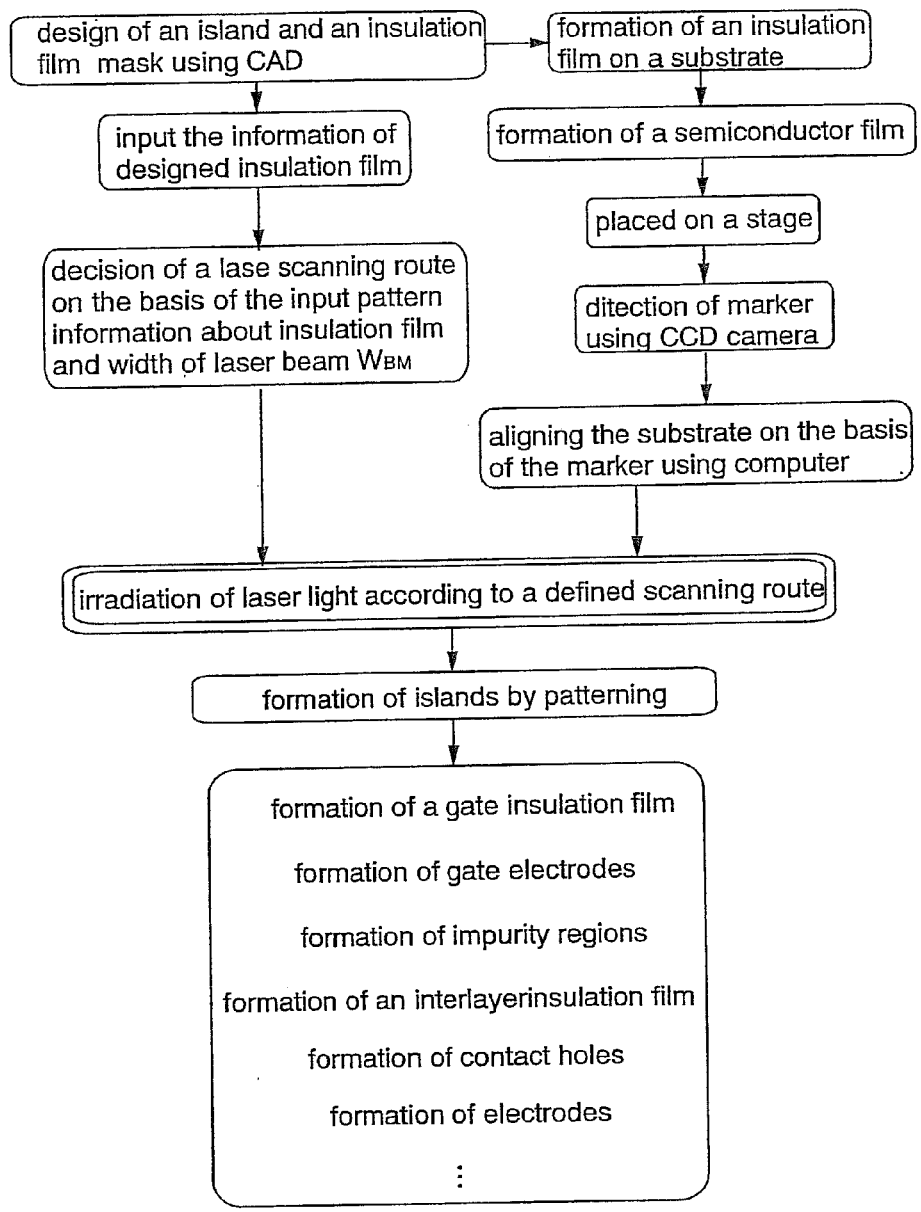
FIG. 5 is a flowchart of a production system of the present invention.

The description given next is about a production system of the present invention. FIG. 5 is a flow chart for a production system of the present invention. First, a mask for an island is designed and then an insulating film is designed to have rectangular or stripe pattern depression and projection portions. One or more channel formation regions are placed on the flat face of a depression portion or projection portion of the insulating film. Desirably, a channel formation region is placed avoiding a region around the midpoint between edges of a depression portion or projection portion where more grain boundaries are formed than the rest. The carrier moving direction in a channel formation region desirably matches the direction of the stripe pattern of the insulating film, or the direction of the longer sides or shorter sides of the rectangular of the insulating film. However, they may be varied intentionally if it suits the use.

The insulating film may be designed to have a marker as its part.

Information relating to the shape of the insulating film designed (pattern information) is inputted to a computer of laser irradiation apparatus and stored in storing means of the computer. The computer decides the laser light scanning path based on the insulating film pattern information inputted and the width in the direction perpendicular to the laser beam scanning direction. It is important in determining the scanning path that the edges of the laser light track do not overlap the flat face of a depression portion or projection portion of the insulating film. The computer may store in its storing means pattern information of an island in addition to the insulating film pattern information, and may decide the scanning path so as to prevent the edges of the laser light track from overlapping the island or a channel formation region of the island.

If a slit is used to control the width of a laser beam, the computer grasps the width of a depression portion or projection portion of the insulating film in the direction perpendicular to the scanning direction from the insulating film pattern information inputted. Then, taking into account the width of a depression portion or projection portion of the insulating film, the width of the slit in the direction perpendicular to the scanning direction is set so as to prevent the edges of the laser light track from overlapping the flat face of a depression portion or projection portion of the insulating film.

After the insulating film is formed on a substrate in accordance with the designed pattern information, a semiconductor film is formed on the insulating film. After the semiconductor film is formed, the substrate is set on a stage of the laser irradiation apparatus and is positioned. In FIG. 5 illustrates an example in which the substrate is positioned by detecting the marker with a CCD camera. A CCD camera refers to a camera using a CCD (charge-coupled device) as an image pickup device.

In another method to position the substrate, a CCD camera or the like is used to detect pattern information of the insulating film or semiconductor film on the substrate that is set on the stage, and then the computer checks the pattern information of the insulating film or semiconductor film actually formed on the substrate which is provided by the CCD camera against information of an insulating film or semiconductor film pattern designed by CAD.

Laser light irradiates the semiconductor film by running along the scanning path determined and crystallizes the semiconductor film.

The semiconductor film having its crystallinity enhanced by the laser light irradiation is patterned to form an island. Subsequently, a process of manufacturing a TFT from the island follows. Although specifics of the TFT manufacturing process are varied depending on the TFT form, a typical process starts with forming a gate insulating film and forming impurity regions in the island. Then an interlayer insulating film is formed so as to cover the gate insulating film and a gate electrode. A contact hole is formed in the interlayer insulating film to partially expose the impurity region. A wire is then formed on the interlayer insulating film to reach the impurity region through the contact hole.

Figure 6:
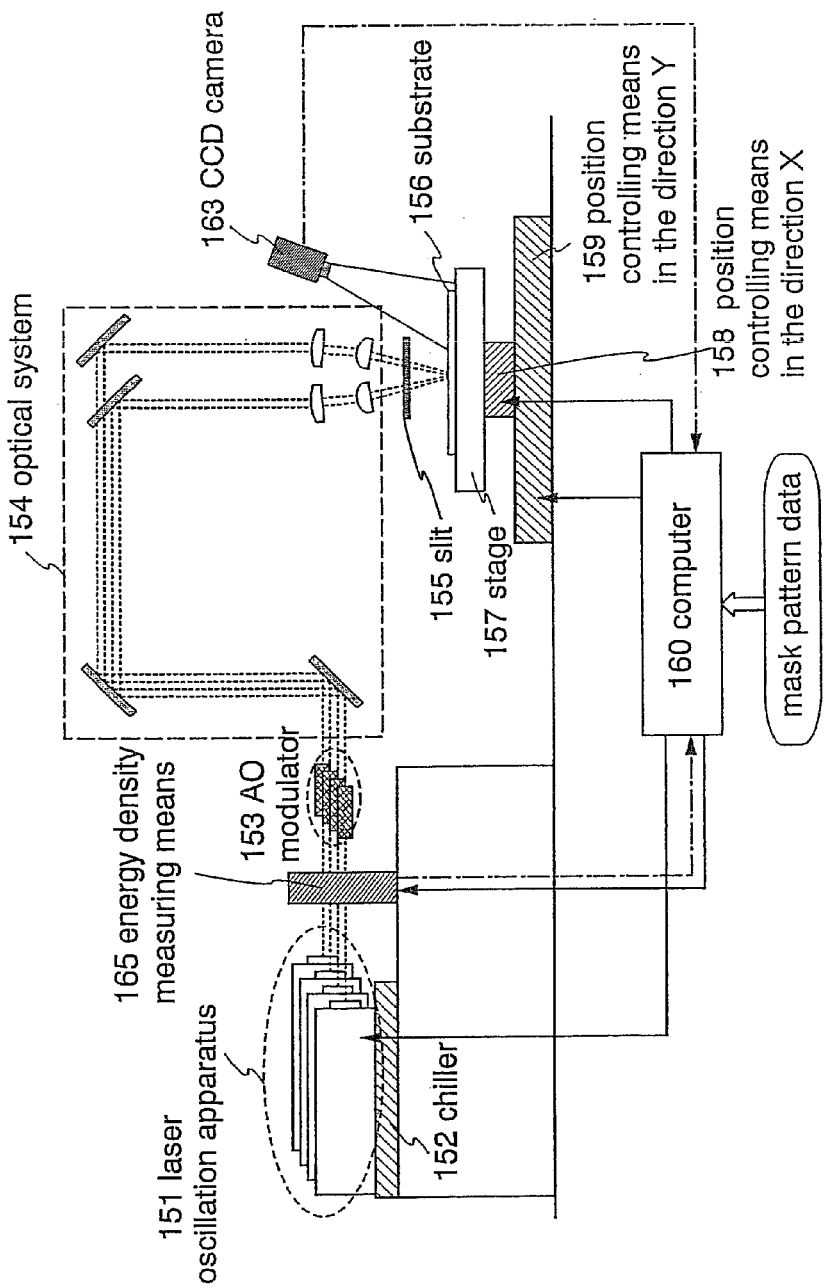
FIG. 6 is a diagram of laser irradiation apparatus.

Next, a description is given with reference to FIG. 6 on the structure of laser irradiation apparatus used in the present invention. Reference symbol 151 denotes laser oscillators. Four laser oscillators are used in FIG. 6 but the number of laser oscillators in the laser irradiation apparatus is not limited thereto.

A chiller 152 may be used to keep the temperature of the laser oscillators 151 constant. Although the chiller 152 is not always necessary, fluctuation in energy of laser light outputted due to a temperature change can be avoided by keeping the temperature of the laser oscillators 151 constant.

Denoted by 154 is an optical system, which changes the path of light emitted from the laser oscillators 151 or manipulates the shape of the laser beam thereof to collect laser light. In the laser irradiation apparatus of FIG. 6, the optical system 154 can also synthesize laser beams of laser light outputted from the plural laser oscillators 151 by partially overlapping the laser beams.

An AO modulator 153 capable of changing the travel direction of laser light in a very short time may be provided in the light path between a substrate 156 that is a processing object and the laser oscillators 151. Instead of the AO modulator, an attenuator (light amount adjusting filter) may be provided to adjust the energy density of laser light.

Alternatively, energy density measuring means 165, namely, means for measuring the energy density of laser light outputted from the laser oscillators 151 may be provided in the light path between the substrate 156 that is a processing object and the laser oscillators 151. Changes with time of measured energy density may be monitored by a computer 160. In this case, output from the laser oscillators 151 may be increased to compensate attenuation in energy density of the laser light.

A synthesized laser beam irradiates through a slit 155 the substrate 156 that is a processing object. The slit 155 is desirably formed of a material that can block laser light and is not deformed or damaged by laser light. The width of the slit 155 is variable and a laser beam can be changed in width by changing the width of the slit.

When laser light emitted from the laser oscillators 151 does not pass through the slit 155, the shape of the laser beam on the substrate 156 is varied depending on the laser type and may be shaped by an optical system.

The substrate 156 is set on a stage 157. In FIG. 6, position controlling means 158 and 159 correspond to means for controlling the position of a laser beam on a processing object. The position of the stage 157 is controlled by the position controlling means 158 and 159.

In FIG. 6, the position controlling means 158 controls the position of the stage 157 in the direction X and the position controlling means 159 controls the position of the stage 157 in the direction Y.

The laser irradiation apparatus of FIG. 6 has the computer 160, which is a central processing unit and at the same time storing means such as a memory. The computer 160 controls oscillation of the laser oscillators 151, determines the laser light scanning path, and controls the position controlling means 158 and 159 to move the substrate to a given position so that a laser beam runs along the scanning path determined.

In FIG. 6, the laser beam position is controlled by moving the substrate. Alternatively, the laser beam position may be moved by an optical system such as a Galvano mirror. The laser beam position may also be controlled by moving both the substrate and the laser beam.

In FIG. 6, the computer 160 controls the width of the slit 155 so that the laser beam spot width can be changed in accordance with mask pattern information. The slit is not always necessary.

The laser irradiation apparatus may also have means for adjusting the temperature of a processing object. A damper may also be provided to prevent reflected light from irradiating a portion that should avoid laser irradiation since laser light is highly directional and has high energy density. Desirably, the damper is absorptive of reflected light. Cooling water may be circulated inside the damper to avoid a temperature rise of the partition wall due to absorption of reflected light. The stage 157 may be provided with means for heating a substrate (substrate heating means).

If a laser is used to form a marker, a laser oscillator for a marker may be provided. In this case, oscillation of the laser oscillator for a marker may be controlled by the computer 160. Another optical system is needed when the laser oscillator for a marker is provided in order to collect laser light outputted from the laser oscillator for a marker. The laser used to form a marker is typically a YAG laser or a $CO_2$ laser, but it is needless to say that other lasers may be employed instead.

One, or more if it is necessary, CCD camera(s) 163 may be provided for positioning that uses a marker. A CCD camera refers to a camera using a CCD (charge-coupled device) as an image pickup device.

Instead of forming a marker, the CCD camera(s) 163 may be used to recognize the pattern of the insulating film or semiconductor film for positioning of the substrate. In this case, insulating film or semiconductor film pattern information by a mask which is inputted to the computer 160 and the actual insulating film or semiconductor film pattern information collected by the CCD camera(s) 163 are checked against each other to grasp the substrate position information.

Part of laser light entering the substrate is reflected by the surface of the substrate and travels back the same light path it has taken upon entering. This is called return light and has adverse effects such as changing the output and frequency of the laser and damaging the rod. In order to remove such return light and stabilize laser oscillation, an isolator may be provided.

Figure 7:
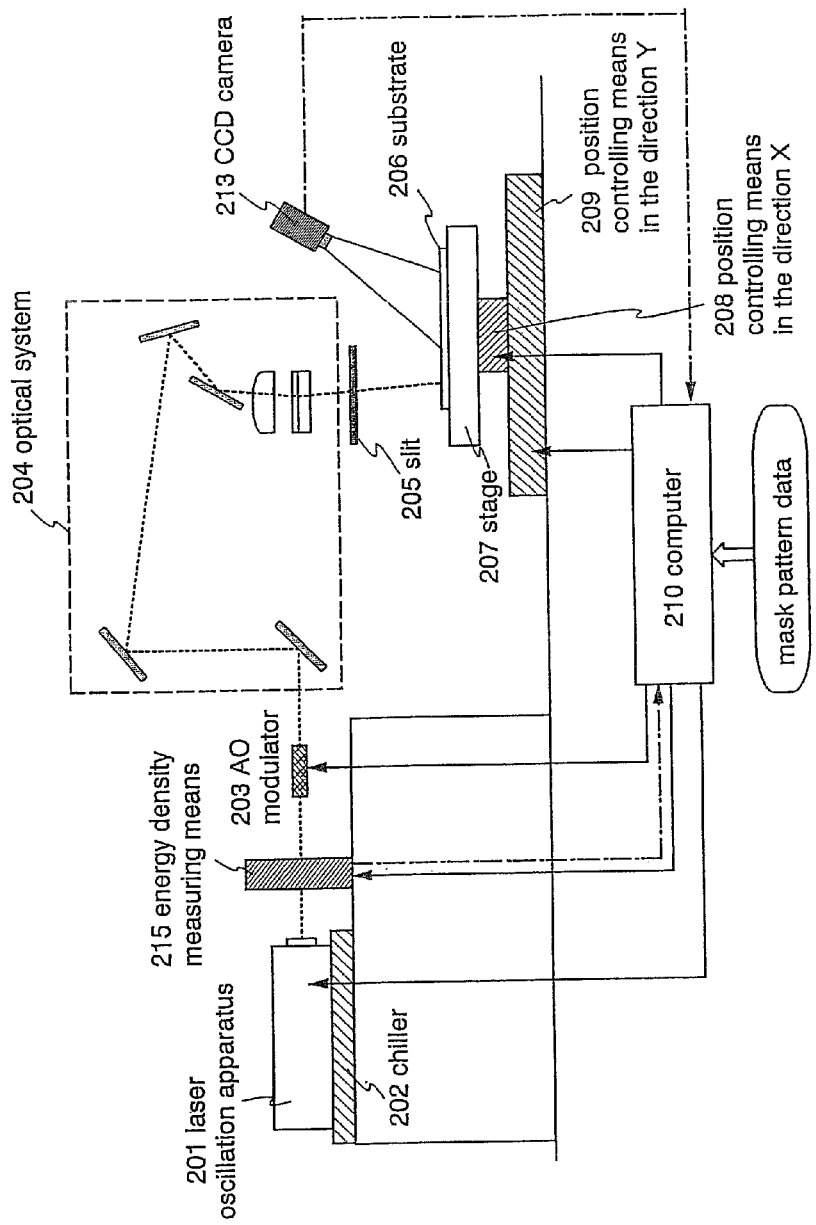
FIG. 7 is a diagram of laser irradiation apparatus.

Although FIG. 6 shows a laser irradiation apparatus structure which has plural laser oscillators, only one laser oscillator may be provided. FIG. 7 shows a laser irradiation apparatus structure which has one laser oscillator. In FIG. 7, 201 denotes a laser oscillator and 202 denotes a chiller. Denoted by 215 is an energy density measuring device, 203, an AO modulator, 204, an optical system, 205, a slit, and 213, a CCD camera. A substrate 206 is set on a stage 207. The position of the stage 207 is controlled by X-direction position controlling means 208 and Y-direction position controlling means 209. Similar to the apparatus shown in FIG. 6, a computer 210 controls operations of the means of this laser irradiation apparatus. The major difference between FIG. 7 and FIG. 6 is that there is one laser oscillator in FIG. 7. Unlike FIG. 6, the optical system 204 only has to have a function of collecting one laser beam.

As described above, in the present invention, a semiconductor film crystallized by laser light is patterned to remove a portion of the film around the midpoint between edges of a depression portion or projection portion. The remaining portion between one edge of a depression portion or projection portion and the midpoint between the one edge and the other edge of the depression portion or projection portion, where fewer grain boundaries are formed to give the film excellent crystallinity, is effectively used as a channel formation region of a TFT. This makes it possible to avoid forming a grain boundary in a channel formation region of a TFT, thereby preventing grain boundaries from lowering the mobility of the TFT greatly, from lowering ON current, and from increasing OFF current. How far from an edge of a depression portion or projection portion is to be removed by patterning can be decided at designer's discretion.

The present invention runs laser light so as to obtain at least the minimum degree of crystallization of a portion that has to be crystallized, instead of irradiating the entire semiconductor film with laser light. As a result, time for laser irradiation of portions that are removed by patterning after crystallization of the semiconductor film can be saved to greatly shorten the processing time per substrate.

Embodiment 1

This embodiment explains how to form an insulating film having depression/projection.

Figure 8A:
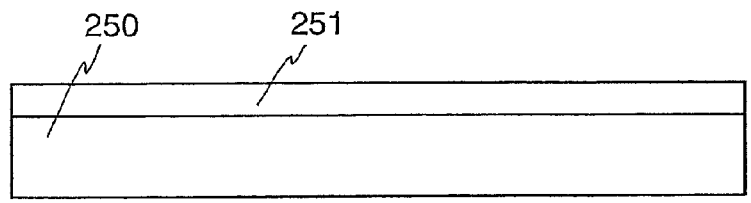
FIGS. 8A to 8D are diagrams showing a method of forming an insulating film that has depression and projection portions.

At first, a first insulating film 251 is formed on a substrate 250, as shown in FIG. 8A. Although the first insulating film 251 uses silicon oxide nitride in this embodiment, this is not limited to, i.e. an insulating film having a great etching selective ratio to a second insulating film is satisfactory. In this embodiment, the first insulating film 251 was formed to a thickness of 50-200 nm using $SiH_4$ and $N_2O$ by a CVD apparatus. Note that the first insulating film may be of a single layer or a layered structure having a plurality of insulating films.

Figure 8B:
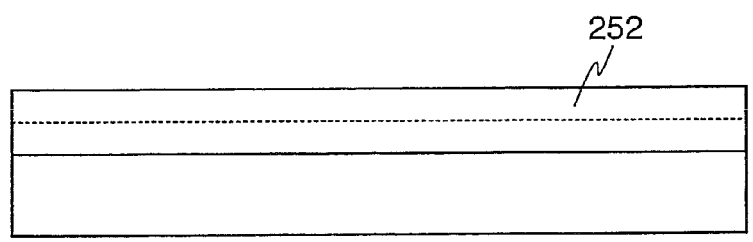

Then, a second insulating film 252 is formed in contact with the first insulating film 251, as shown in FIG. 8B. The second insulating film 252 requires a film thickness to a degree that, when a depression-projection is formed thereon by patterning in a subsequent process, the depression-projection appears on a surface of a semiconductor film to be subsequently deposited. This embodiment forms, as the second insulating film 252, silicon oxide having 30 nm-300 nm by a plasma CVD.

Figure 8C:
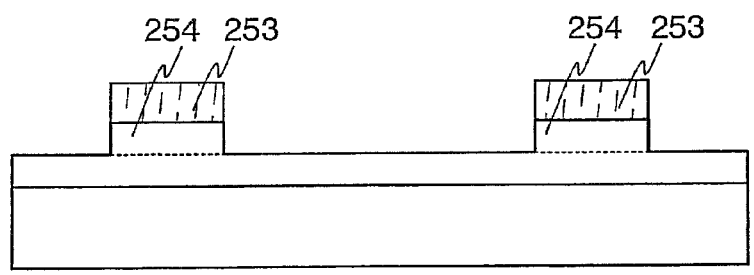
Figure 8D:
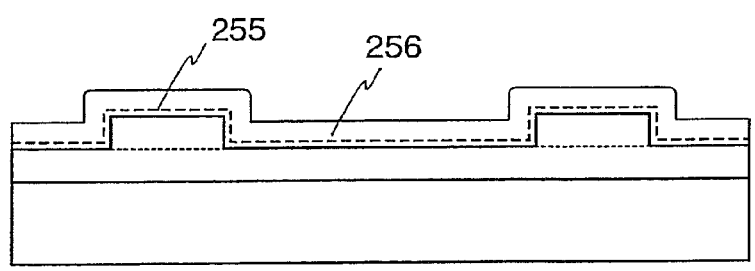

Next, a mask 253 is formed as shown in FIG. 8C to etch the second insulating film 252. This embodiment conducts wet etching at 20° C. using an etchant of a mixture solution containing 7.13% of ammonium hydrogen fluoride ($NH_4HF_2$) and 15.4% of ammonium fluoride ($NH_4F$) (product name: LAL500 by Stella Chemifa Corporation). This etching forms a projection part 254 in a rectangular or stripe form. In this specification, a combination of the first insulating film 251 and the projection part 254 is considered as one insulating film. And then, the mask 253 is removed.

Then, a semiconductor film is formed covering the first insulating film 251 and projection part 253. Because in the embodiment the projection part has a thickness of 30 nm-300 nm, the semiconductor film is desirably given a film thickness of 50-200 nm, herein 60 nm. Incidentally, in case an impurity is mixed between the semiconductor film and the insulating film, there is a possibility that bad affection is exerted to the crystallinity of semiconductor film to increase the characteristic and threshold voltage variation of the TFT fabricated. Accordingly, the insulating film and the semiconductor film are desirably formed continuously. For this reason, in this embodiment, after forming an insulating film comprising the first insulating film 251 and the projection part 253, a silicon oxide film is formed in a small thickness on the insulating film, followed by continuously forming a semiconductor film 256 without exposure to the air. The thickness of silicon oxide film, although properly set by the designer, was given 5 nm-30 nm in this embodiment.

Incidentally, when etching the second insulating film 252, the projection part may be etched into a taper form. By making the projection part in a taper form, a semiconductor film, gate insulating film or gate electrode is prevented from having disconnection at a projection-region edge.

Figure 9A:
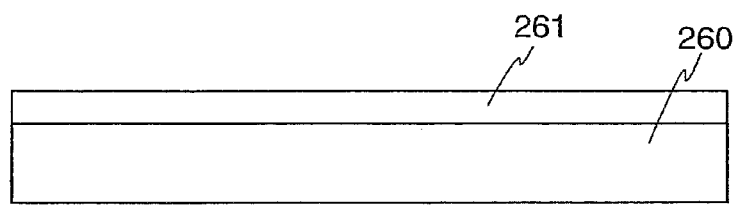
FIGS. 9A to 9C are diagrams showing a method of forming an insulating film that has depression and projection portions.

Now, explanation is made on a different way to form an insulating film. At first, a first insulating film 261 is formed on a substrate 260, as shown in FIG. 9A. The first insulating film 261 is formed of silicon oxide, silicon nitride or silicon oxide nitride.

In the case of using a silicon oxide nitride film, it can be formed by mixing Tetraethyl Ortho Silicate (TEOS) and $O_2$ and subjecting it to a plasma CVD with discharge under a reaction pressure of 40 Pa, at a substrate temperature of 300-400° C. and with a radio frequency (13.56 MHz) power density of 0.5-0.8 $W/cm^2$. In the case of using a silicon oxide nitride film, it may be formed by a plasma CVD with a silicon oxide nitride film formed from $SiH_4$, $N_2O$ and $NH_3$ or a silicon oxide nitride film formed from $SiH_4$ and $N_2O$. This is performed under a forming condition of a reaction pressure of 20-200 Pa and a substrate temperature of 300-400° C., with a radio frequency (60 MHz) power density of 0.1-1.0 $W/cm^2$. Meanwhile, a silicon oxide nitride hydride film may be used that is to be formed from $SiH_4$, $N_2O$ and $H_2$. A silicon nitride film can be similarly formed from $SiH_4$ and $NH_3$ by a plasma CVD.

Figure 9B:
Figure 9C:
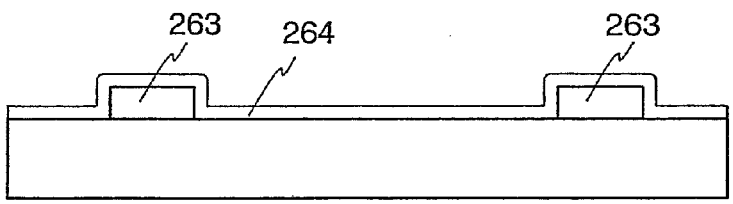

After forming a first insulating film 261 to a thickness of 20-200 nm (preferably 30-60 nm) over the entire surface of the substrate, a mask 262 is formed by using a photolithography technique as shown in FIG. 9B. Unwanted regions are removed away to form a projection part 263 in a stripe or rectangular form. To remove away unwanted regions, a dry etching process may be used that uses a fluorine-based gas. Otherwise, a wet etching process may be used that uses a fluorine-based solution. In the case of selecting the latter, etching is preferably conducted using a mixture solution containing 7.13% of ammonium hydrogen fluoride ($NH_4HF_2$)

and 15.4% of ammonium fluoride (NH$_4$F) (product name: LAL500 by Stella Chemifa Corporation). And then, the mask 262 is removed.

Then, a second insulating film 264 is formed covering the projection part 263 and substrate 260. This layer is formed of silicon oxide, silicon nitride or silicon oxide nitride to a thickness of 50-300 nm (preferably 100-200 nm), similarly to the first insulating film 261.

By the above fabrication process, an insulating film is formed comprising the projection part 263 and the second insulating film 264. After forming the second insulating film 264, by continuously forming a semiconductor film without exposure to the air, the impurities in the air are prevented from mixing between the semiconductor film and the insulating film.

Embodiment 2

This embodiment explains an example that a semiconductor film formed on an insulating film in a stripe form is crystallized by laser light irradiation and thereafter mutually isolated islands are formed on a surface parallel with an projection-formed substrate to fabricate TFT using the islands.

Figure 10A:
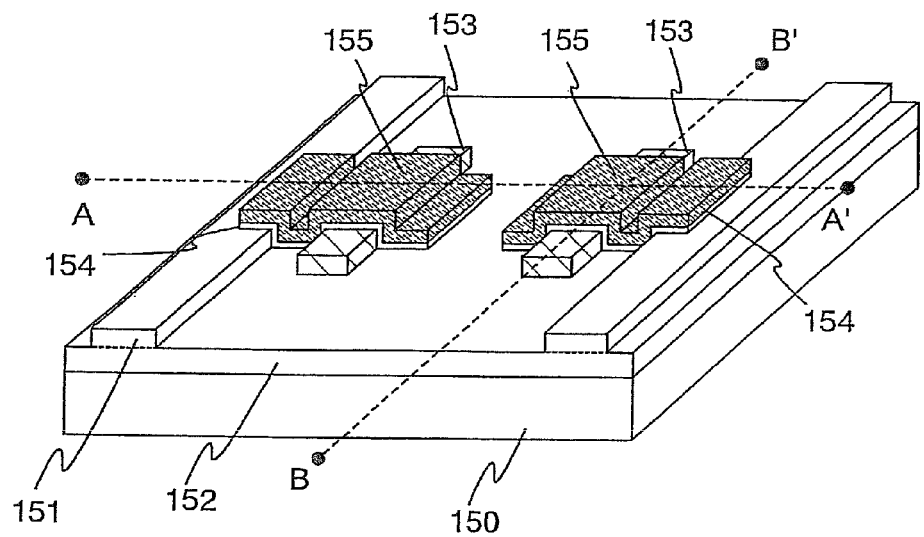
FIGS. 10A to 10C are diagrams of TFTs formed from islands that are separated from each other.

FIG. 10A shows a TFT structure of this embodiment. In FIG. 10A, an insulating film 152 having striped projection parts 151 is formed on a substrate 150. A plurality of islands 153 are formed, isolated from one another, on the top surfaces of the projection parts 151. An gate insulating film 154 is formed in a manner contacting with the islands 153. Incidentally, although the gate insulating film 154 in FIG. 10A is formed exposing the regions, to be made into impurity regions, of the island, it may be formed covering the entire island 154.

A plurality of gate electrodes 155 is formed on the gate insulating film 154 in a manner superposed over a plurality of islands 153. The plurality of gate electrodes 155 may be mutually connected depending upon a circuit configuration.

Figure 10B:
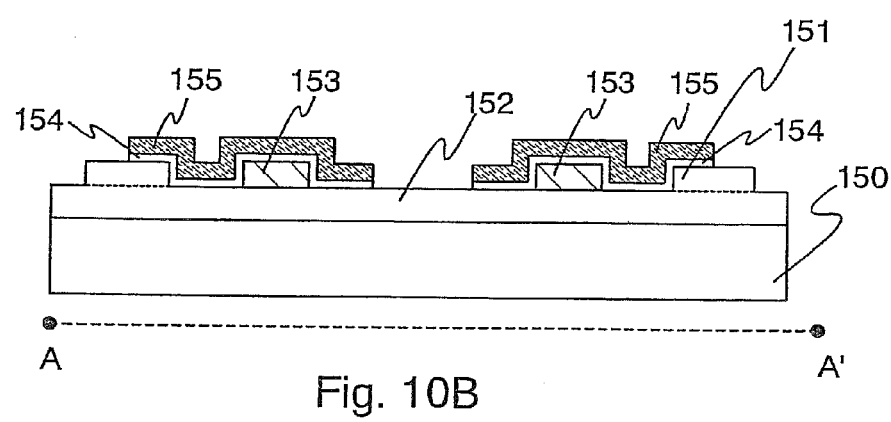
Figure 10C:
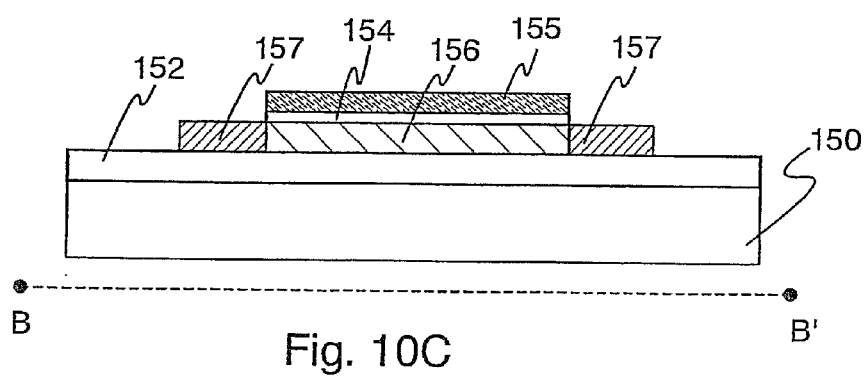
Figure 20A:
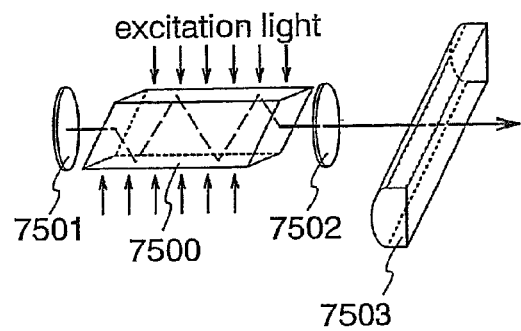
FIGS. 20A to 20C are diagrams of optical systems.

Note that the sectional view on the line A-A' in FIG. 20A corresponds to FIG. 10B while the sectional view on the line B-B' in FIG. 10A corresponds to FIG. 10C. As shown in FIG. 10C, each gate electrode 155 is superposed on a channel region 156 of the island 153 with gate insulating film 154 sandwiched therebetween. The channel region 156, in turn, is sandwiched between two impurity regions 157 included also in the island 153.

In this embodiment TFT is formed by using an island formed at the bottom of the depression part. TFT can also be formed by using an island on top of the projection part.

This embodiment can be implemented by combining with Embodiment 1.

Embodiment 3

This embodiment explains variations of insulating film forms.

Figure 11A:
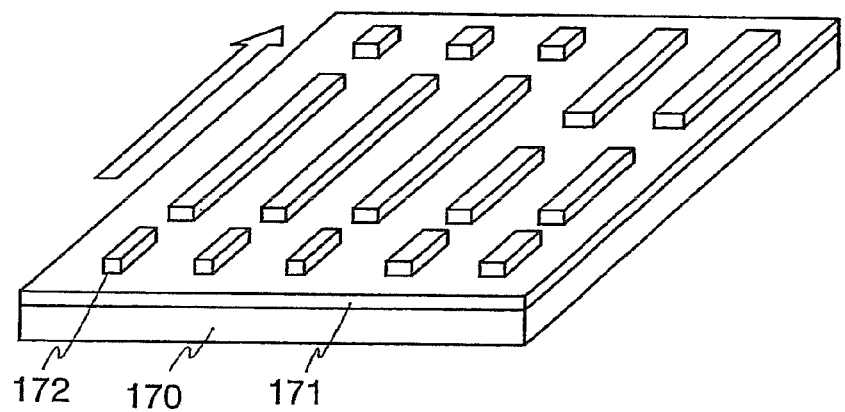
FIGS. 11A and 11B are diagrams showing shapes of an insulating film that has depression and projection portions.

FIG. 11A shows an embodiment on an insulating film form of the invention. In FIG. 11A, an insulating film 171 is formed on a substrate 170 wherein the insulating film 171 has a plurality of projection parts 172. The projection part 172 is rectangular in form as viewed from the above. All the projection parts have respective rectangular longer or shorter sides in a direction parallel with a scanning direction of laser light shown by the arrow.

The projection parts 172 are not necessarily identical to one another in the width in laser-light scanning direction and the width perpendicular to the scanning direction. A form of an insulating film is desirably designed to meet a desired island form.

Figure 11B:
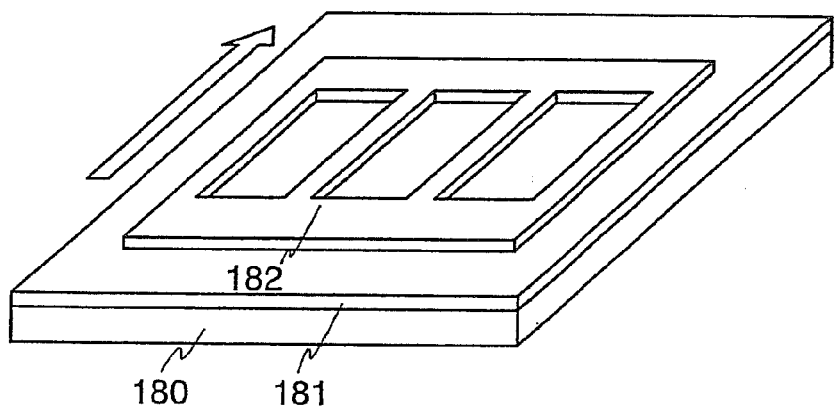

It is not necessary that projection parts of the insulating film using the present invention being completely striped. It is need only a portion of the insulating film is striped or rectangular. FIG. 11B shows an embodiment on an insulating film form of the invention. In FIG. 11B, an insulating film 181 is formed on a substrate 180. The insulating film 181 is formed with a rectangular projection part 182 having slit-like openings as viewed from the above. In the projection part 182, the slit has a longer or shorter side in parallel with a scanning direction of laser light shown by the arrow.

Explanation is now made on an example of a TFT structure formed by using the insulating film having slit-like openings shown in FIG. 11B.

Figure 12A:
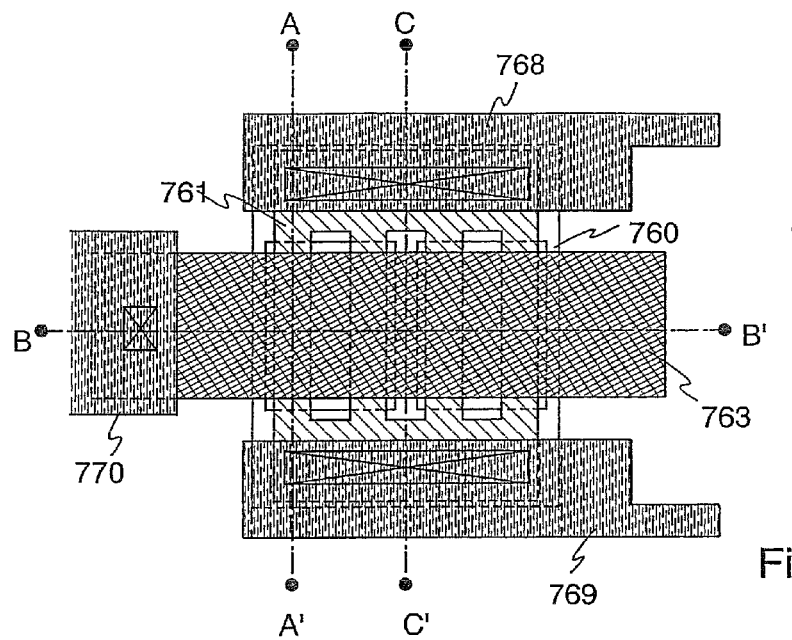
FIGS. 12A to 12D are a top view and sectional views of a TFT that is formed from the insulating film shown in FIG. 11B.

FIG. 12A shows a top view of the TFT of this embodiment. As shown in FIG. 12A, this embodiment used an insulating film having a rectangular projection part 760 having therein slit-like openings. A semiconductor film is formed covering the projection part 760. Laser light is scanned, in a direction shown by the arrow, along a direction of a longer axis of the slit-like opening to crystallize the semiconductor film. Then, the semiconductor film is patterned to form an island 761 having an opening formed in the upper surface of the projection part. The channel region of the island 761 avoids using the vicinity of a center between edges of depression part to use a portion having high crystallinity between the edge-neighborhood of a depression part and the vicinity of a center between edges of a depression part Then, a gate insulating film 762 is formed in a manner contacting with the island 761. Then, a conductive film is formed on the gate insulating film 762. By patterning the conductive film, a gate electrode 763 is formed. The gate electrode 763 is superposed on a channel region 764 of the island 761 with gate insulating film 762 sandwiched therebetween. The channel region 764 is sandwiched between the two impurity regions 765 included in the island 761.

A first interlayer insulating film 766 is formed covering the gate electrode 763, island 761 and gate insulating film 762. The first interlayer insulating film 766 is formed of inorganic insulator having an effect to prevent a substance, such as alkali metal, having a bad effect upon TFT characteristics from mixing in the island 761.

Figure 12B:
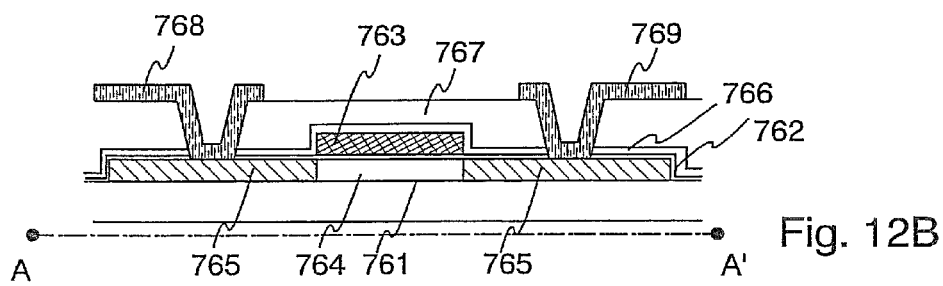
Figure 12C:
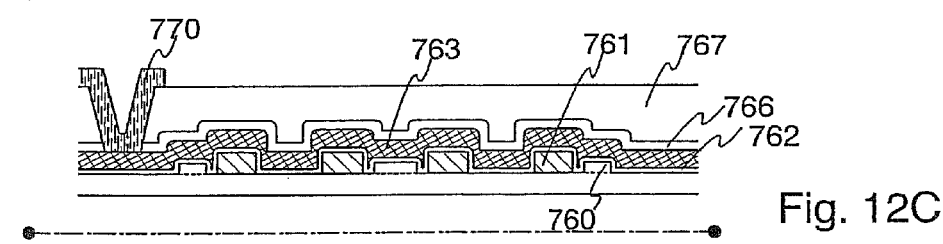
Figure 12D:
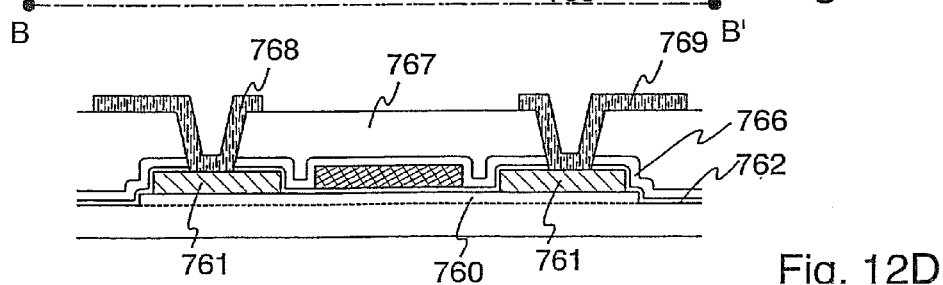

A second interlayer insulating film 767 is formed of organic resin on the first interlayer insulating film 766. Openings are formed, by etching, through the second interlayer insulating film 767, first interlayer insulating film 766 and gate insulating film 762. Through the openings, the interconnections 768, 769 are formed on the second interlayer insulating film 767, respectively connecting between the two impurity regions 765 and the gate electrode 763. Note that the sectional view on the line A-A' in FIG. 12A is shown in FIG. 12B, the sectional view on the line B-B' in FIG. 12C and the sectional view on the line C-C' in FIG. 12D.

In this embodiment, channel regions 764 are formed in plurality and the channel regions are isolated from each other. Accordingly, by increasing the channel width of the channel region, the heat generated by driving the TFT can be efficiently dissipated while securing on-current.

In this embodiment, TFT having a channel region formed at the bottom of the depression part is described though, it can also be formed by using channel region formed on top of the projection part.

Embodiment 4

Figure 14:
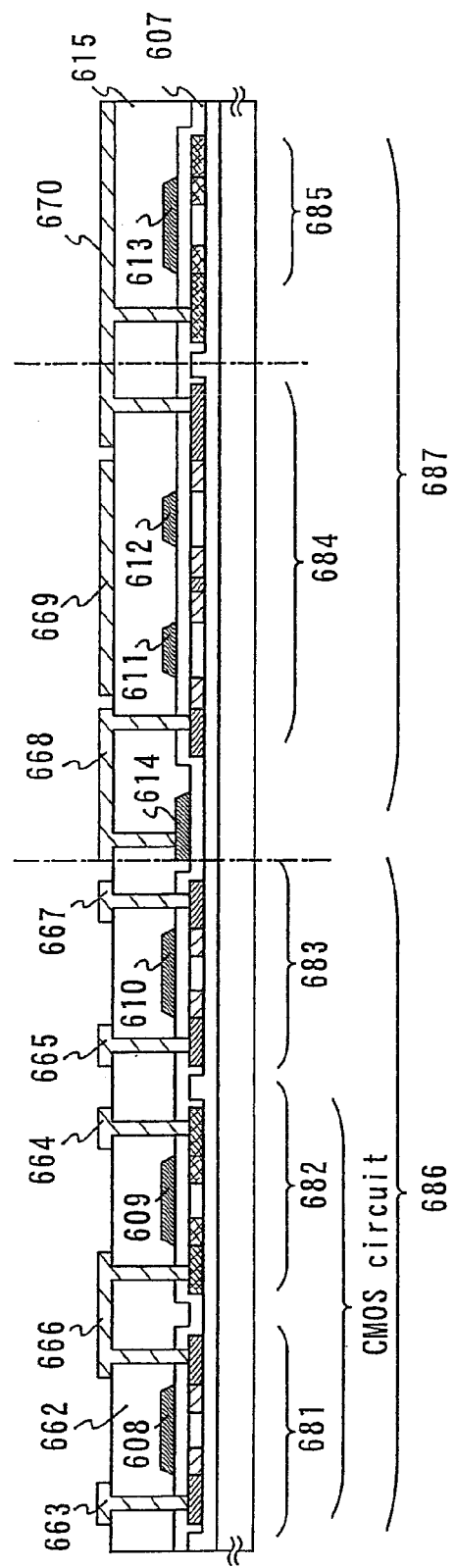
FIG. 14 is a diagram showing a method of manufacturing a semiconductor device using the present invention.

This embodiment explains a method for manufacturing an active-matrix substrate using a laser crystallization method of the invention, by using FIGS. 13 and 14. In this specification, the substrate forming, on the same substrate, a CMOS circuit and a pixel region having drive circuit, pixel TFTs and hold capacitances is referred to as an active-matrix circuit, for ease of description.

This embodiment uses a substrate 600 formed of a glass such as barium borosilicate glass or aluminum borosilicate glass. The substrate 600 may use a quartz, silicon, metal or stainless steel substrate formed with an insulating film on a surf ace thereof. Otherwise, a plastic substrate may be used that has a heat resistance to withstand at process temperature in this embodiment.

Then, an insulating film of silicon oxide, silicon nitride or silicon oxide nitride is formed in a thickness of 100-300 nm on the substrate 600, by the known means (a sputtering, an LPCVD, a plasma CVD or the like).

Next, in order to form a large and small thickness regions in the insulating film, the embodiment forms a resist mask 693 by a photolithography technique and carries out an etching process on it. Although the dimension of a step is determined by an etching amount, the embodiment provides nearly 50-100 nm. For example, to etch a silicon oxide nitride film having 150 nm by 75 nm, it is possible to use wet etching using a solution containing hydrogen fluoride or applying a dry etching using $CF_4$. In this manner, an insulating film 601 formed with a projection form is formed. In this case, the width of a projection part perpendicular to a scanning direction may be properly determined taking a TFT size into consideration, preferably a size (in diameter or diagonal length) of approximately 2-6 μm for the purpose of controlling the number of crystal-nucleation (FIG. 13A).

Then, an amorphous semiconductor film 692 is formed in a thickness of 25-80 nm (preferably 30-60 μm) on the insulating film 601, by the known means (sputter process, LPCVD process, plasma CVD process or the like) (FIG. 13B). Incidentally, although this embodiment forms an amorphous semiconductor film, a fine crystal semiconductor film or crystalline semiconductor film is also applicable. Otherwise, an amorphous-structured compound semiconductor film, such as an amorphous silicon-germanium film, may be used.

Next, the amorphous semiconductor film 692 is crystallized by a laser crystallization method. The scanning direction of laser light is parallel with an extension of the striped projection part of insulating film 601. Incidentally, where the projection part of insulating film 601 is rectangular as viewed from the above of the substrate, the scanning direction of laser light is defined parallel with a direction of a longer or shorter side of the rectangle. Specifically, laser light is preferentially irradiated according to the information about mask inputted to the computer of the laser irradiation apparatus. Of course, besides the laser crystallization method, this may be combined with other known crystallization methods (thermal crystallization method using RTA or furnace anneal, thermal crystallization method using a metal element to promote crystallization, or the like). Although the embodiment shows an example to change a laser beam width to a width of insulating film perpendicular to a scanning direction by the use of a slit, the invention is not limited to this, i.e. the slit is not necessarily required to be used.

In crystallizing the amorphous semiconductor film, by using a continuous oscillatable solid laser and a second to fourth harmonic of basic wave, an increased grain size of crystal can be obtained. Typically, desirably used is the second harmonic (532 nm) or third harmonic (355 nm) of an $Nd:YVO_4$ laser (basic wave: 1064 nm). Specifically, the laser light emitted from a continuous-oscillation $YVO_4$ laser is changed into a harmonic by a nonlinear optical device to obtain a 10 W-output laser light. Meanwhile, there is a method that an $YVO_4$ crystal and a nonlinear optical device are inserted in a resonator to emit a higher harmonic. Preferably, laser light is formed by an optical system into a rectangular or elliptic form on irradiation plane, which is irradiated to a subject to be worked. The energy density, in this case, requires approximately 0.01-100 $MW/cm^2$ (preferably 0.1-10 $MW/cm^2$). For irradiation the semiconductor film is moved at a speed of approximately 10-2000 cm/s relatively to laser light.

In laser irradiation can be used a pulse-oscillation or continuous-oscillation gas laser or solid laser. Gas lasers includes an excimer laser, an Ar laser and a Kr laser. Solid lasers include a YAG laser, a $YVO_4$ laser, a YLF laser, a $YAlO_3$ laser, a glass laser, a ruby laser, an alexandorite laser, a Ti:sapphire laser and a $Y_2O_3$ laser. As the solid laser can be used a laser using a crystal of YAG, $YVO_4$, YLF or $YAlO_3$ doped with Cr, Nd, Er, Ho, Ce, Co, Ti Yb or Tm. Also, a slab laser is usable. The laser has a different basic wave depending upon a doping material, providing laser light having a basic wave at around 1 μm. The harmonic to basic wave is available by the use of a non-linear optical device.

The foregoing laser crystallization forms a crystalline semiconductor film 694 enhanced in crystallinity (FIG. 13C). In the crystalline semiconductor film, grain boundaries 695 tend to occur in the vicinity of center between edges.

Next, the crystalline semiconductor film 694 enhance in crystallinity is patterned into a desired form to form crystallized islands 602-606 (FIG. 13D). Here, a number of grain boundaries in the islands 602 to 606 can be suppressed by removing the vicinity of a center between an edge of the depression or projection part where the grain boundaries 695 tend to occur.

After the islands 602 to 606 are formed, the islands may be doped with a minute amount of impurity element (boron or phosphorus) in order to control the threshold of TFTs.

Subsequently, a process of manufacturing TFTs from the islands 602 to 606 follows. Although specifics of the TFT manufacturing process are varied depending on the TFT form, a typical process starts with forming a gate insulating film and forming impurity regions in the islands. Then an interlayer insulating film is formed so as to cover the gate insulating film and a gate electrode. A contact hole is formed in the interlayer insulating film to partially expose the impurity regions. A wire is then formed on the interlayer insulating film to reach the impurity regions through the contact hole.

FIG. 14 is a sectional view of the semiconductor device of this embodiment. The islands 602 to 606 have channel formation regions, first impurity regions, and second impurity regions. Each channel formation region is sandwiched between two first impurity regions. Each second impurity region is formed between one first impurity region and one channel formation region. The concentration of an impurity element that gives one conductivity type is higher in a first impurity region than in a second impurity region. A gate insulating film 607 is formed to cover the islands 602 to 606. On the gate insulating film 607, gate electrodes 608 to 613 are formed overlapping the channel formation regions and a source signal line 614 is also formed. An interlayer insulating film 615 is formed on the gate insulating film 607 so as to cover the gate electrodes 608 to 613 and the source signal line 614.

In a driving circuit 686, formed on the interlayer insulating film 615 are wires 663 to 667, which are electrically connected to the impurity regions. In a pixel portion 687, a pixel electrode 670, a gate wire 669, and a wire 668 are formed. The wire 668 electrically connects the source signal line 614 with a pixel TFT 684.

Although not shown in the drawing, the gate wire 669 is electrically connected to the gate electrodes 611 and 612 of the pixel TFT 684. The pixel electrode 670 is electrically connected to a first impurity region of the pixel TFT and is electrically connected to the island 606, which functions as one of electrodes constituting capacitor storage 685. In this application, the pixel electrode and the wires are formed from the same material. However, the pixel electrode 670 may be formed from a highly reflective material such as a film mainly containing Al, a film mainly containing Ag, or a laminate of films containing Al and Ag.

The driving circuit 686, which has a CMOS circuit composed of an n-channel TFT 681 and a p-channel TFT 682 and has an n-channel TFT 683, and the pixel portion 687, which has the pixel TFT 684 and the capacitor storage 685, can thus be formed on the same substrate to complete an active matrix substrate. The capacitor storage 685 is composed of the electrode 613 and the island 606 with the gate insulating film 607 as dielectric.

According to the pixel structure of this embodiment, edges of a pixel electrode overlap a source signal line so that the gap between pixel electrodes is shielded against light without using a blocking film.

Although the structure of an active matrix substrate used in a liquid crystal display device is described in this embodiment, the manufacturing process of this embodiment can also be employed to manufacture a light emitting device. "Light emitting device" is a generic term for a display panel in which a light emitting element is formed on a substrate and sealed between the substrate and a cover member, and for a display module obtained by mounting a TFT and the like to the display panel. A light emitting element has a layer (light emitting layer) containing an organic compound that provides luminescence upon application of electric field (electroluminescence), as well as an anode layer and a cathode layer.

In a light emitting element, a hole injection layer, an electron injection layer, a hole transporting layer, an electron transporting layer, or the like may be formed from an inorganic compound alone or from a material obtained by mixing an inorganic compound with an organic compound. These layers may be partially blended with one another.

The present invention is also applicable to a semiconductor element of sub-micron level. In the example shown in this embodiment, an active layer is formed on the bottom of a depression portion. Alternatively, an active layer may be formed on the top of a projection portion.

Embodiment 5

This embodiment explains an example of a combination of a laser irradiation process and a semiconductor film crystallizing process using a catalyst when crystallizing a semiconductor film. In the case of using a catalytic element, desirably used is an art disclosed in JP-A-130652/1995 and JP-A-78329/1996.

Figure 15A:
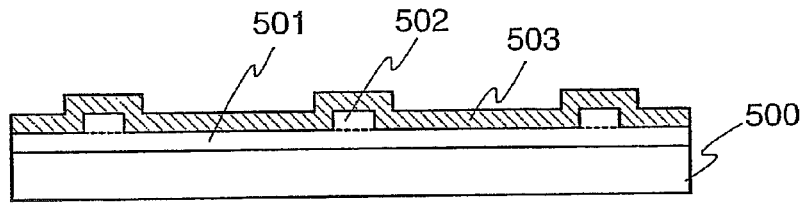
FIGS. 15A to 15E are diagrams showing a method of crystallizing a semiconductor film using a catalytic metal.

At first, as shown in FIG. 15A, an insulating film 501 having a projection part 502 is formed on a substrate 500. Then, a semiconductor film 503 is formed on the insulating film 501.

Figure 15B:
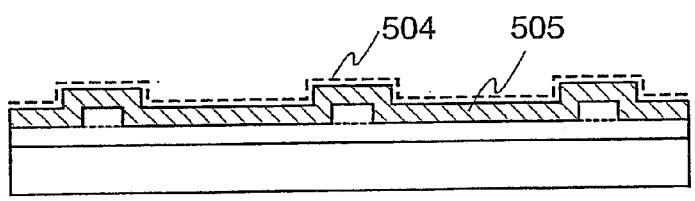
Figure 15C:
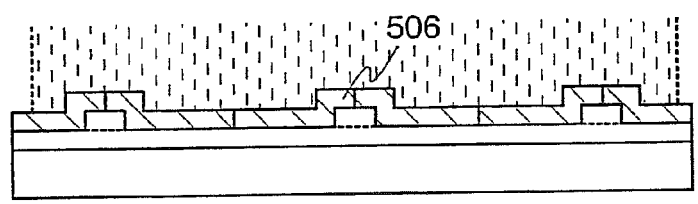

Next, a catalytic element is used to crystallize the semiconductor film 503 (FIG. 15B). For example, in the case of using the art disclosed in JP-A-130652/1995, a nickel acetate solution containing 10 ppm nickel by weight is applied onto the semiconductor film 503 to form a nickel-containing layer 504. After a dehydrogenation process at 500° C. for 1 hour, thermal process is carried out at 500-650° C. for 4-12 hours, e.g. at 550° C. for 8 hours, to form a semiconductor film 505 enhanced in crystallinity. Incidentally, usable catalytic elements may be an element of germanium (Ge), iron (Fe), palladium (Pd), tin (Sn), lead (Pb), cobalt (Co), platinum (Pt), copper (Cu) or Gold (Au), besides nickel (Ni).

By laser irradiation, a semiconductor film 506 further enhanced in crystallinity is formed from the semiconductor film 505 crystallized by the heat treatment using Ni. The semiconductor film 506 obtained by laser irradiation contains a catalytic element. After laser irradiation, carried out is a process to remove the catalytic element from the semiconductor film 506 (gettering). For gettering, it is possible to use an art described in JP-A-135468/1998 or JP-A-135469/1998.

Figure 15D:
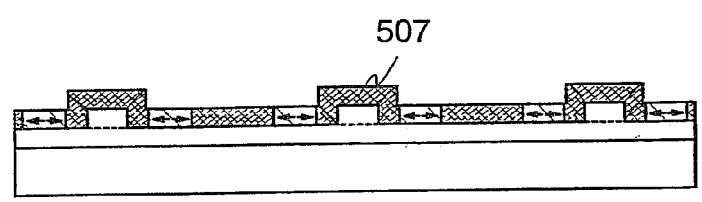

Specifically, a phosphorus-added region 507 is formed in a part of a semiconductor film 506 obtained after laser irradiation. Thermal process is carried out in a nitrogen atmosphere at 550-800° C. for 5-24 hours, e.g. at 600° C. for 12 hours. Then, the phosphorus-added region 507 of the semiconductor film 506 acts as a gettering site to aggregate the catalytic element existing in the semiconductor film 506 to the phosphorus-added region 507 (FIG. 15D).

Figure 15E:
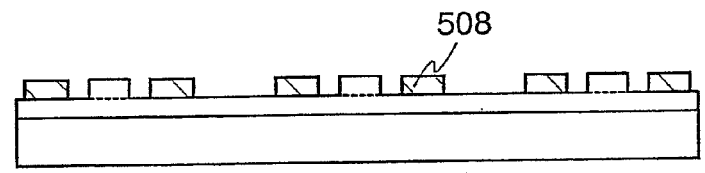

Thereafter, the phosphorus-added region 507 of the semiconductor film 506 is removed by patterning, thereby obtaining an island 508 reduced in catalytic element concentration to $1 \times 10^{17}$ atoms/cm$^3$ or less, preferably to approximately $1 \times 10^{16}$ atoms/cm$^3$ (FIG. 15E).

Incidentally, after applying a solution containing a catalytic element to the semiconductor film of prior to crystallization, crystal growth may be by laser light irradiation instead of SPC.

This embodiment can be implemented in combination with Embodiments 1-4.

Embodiment 6

This embodiment explains the form of a laser beam combined by superposing together a plurality of laser beams.

Figure 16A:
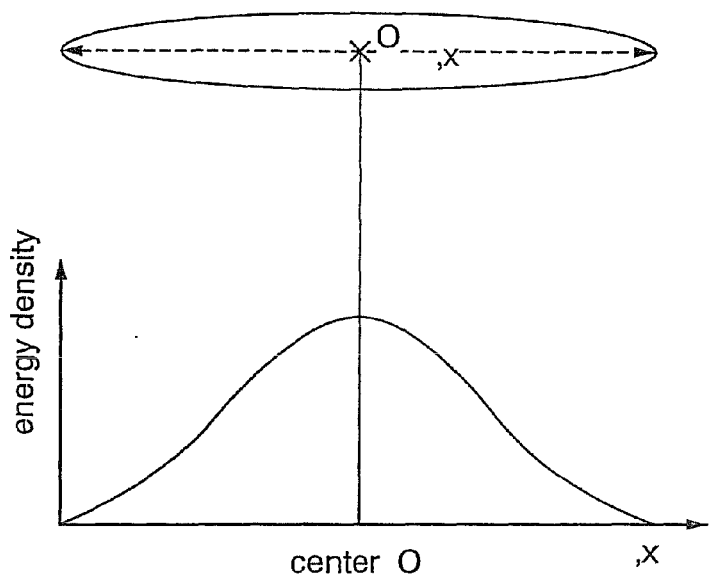
FIGS. 16A and 16B are diagrams showing the energy density distribution of a laser beam.

FIG. 16A shows an example of a laser beam form on a subject to be processed in the case that laser light is oscillated from a plurality of laser oscillators without a slit and n laser light energy density distribution in a major-axis. The laser beam shown FIG. 16A is elliptic in form. Incidentally, in the invention, the laser beam form of laser light oscillated from the laser oscillator is not limited to the elliptic. The laser beam form is different depending on a laser kind and can be formed by an optical system. For example, the laser light emitted from an XeCl excimer laser (wavelength 308 nm, pulse width 30 ns) L3308 by Lambda is rectangular in form having 10 mm×30 mm (each, width at half maximum in beam profile). The laser light emitted from a YAG laser is circular in form if a rod is cylindrical and rectangular in form if it is a slab type. By further forming such laser light by an optical system, a desired size of laser light can be formed.

The laser light has an energy density distribution increasing toward an elliptic center O. In this manner, the laser beam has an energy density in a center axis direction following the Gaussian distribution, wherein the region is narrow where energy density is to be determined uniform.

Figure 16B:
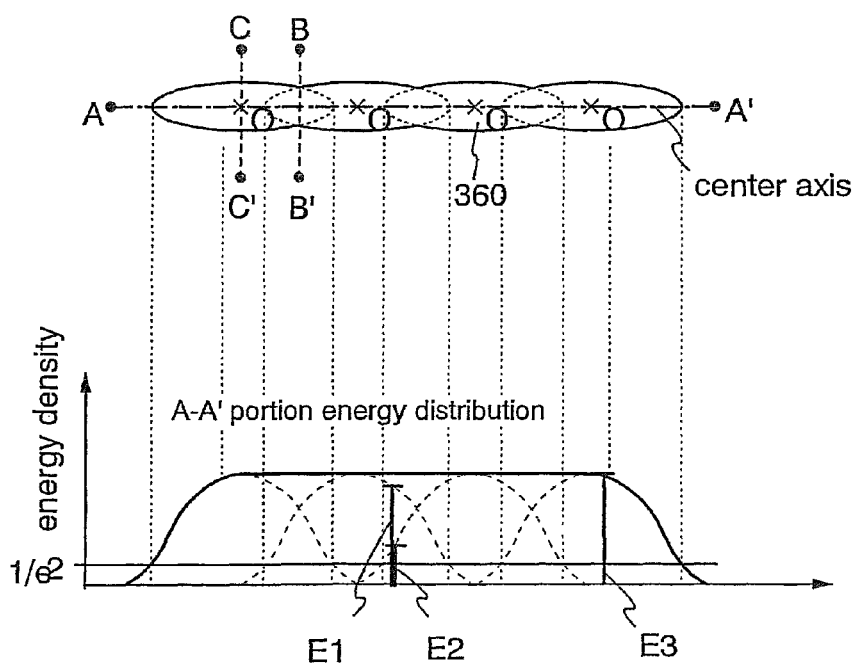

FIG. 16B shows a laser beam form when the laser light having a laser beam of FIG. 16A is combined together. Although FIG. 16B shows the case that four laser-light laser beams are superposed together to form one linear laser beam, the number of laser beams superposed is not limited to that.

As shown in FIG. 16B, the laser beams of laser light are combined together by partly superposed one over another with their major axes placed in coincidence, thereby being formed into one laser beam 360. Note that, hereinafter, a straight line obtained by connecting the ellipse centers O is assumed to be a center axis of the laser beam 360.

FIG. 16B shows the laser-light energy density distribution in a center-axis y-direction of a combined laser beam. Energy density is added on in the overlapped areas of the uncombined laser beams. For example, adding the energy densities E1 and E2 together of the overlapped beams as shown in the figure, it becomes nearly equal to a peak value E3 of beam energy density. Thus, energy density is flattened between the elliptic centers O.

Incidentally, the addition of E1 and E2 together, ideally, equals to E3, practically an equal value is not necessarily obtainable. It is possible for the designer to appropriately set an allowable range of deviation between the added value of E1 and E2 and the value of E3.

With the use of a single laser beam, the energy density distribution follows the Gaussian distribution. Accordingly, it is difficult to irradiate an even energy density of laser light to the entire of a semiconductor film contacting with the flat region of insulating film or a part to be made into an island. However, as can be seen from FIG. 16B, by superposing together a plurality of laser light to mutually compensate for the regions low in energy density, the region having a uniform energy density is broadened rather than the single use thereof without superposing a plurality of laser light. This can efficiently enhance the crystallinity of a semiconductor film.

Figure 17A:
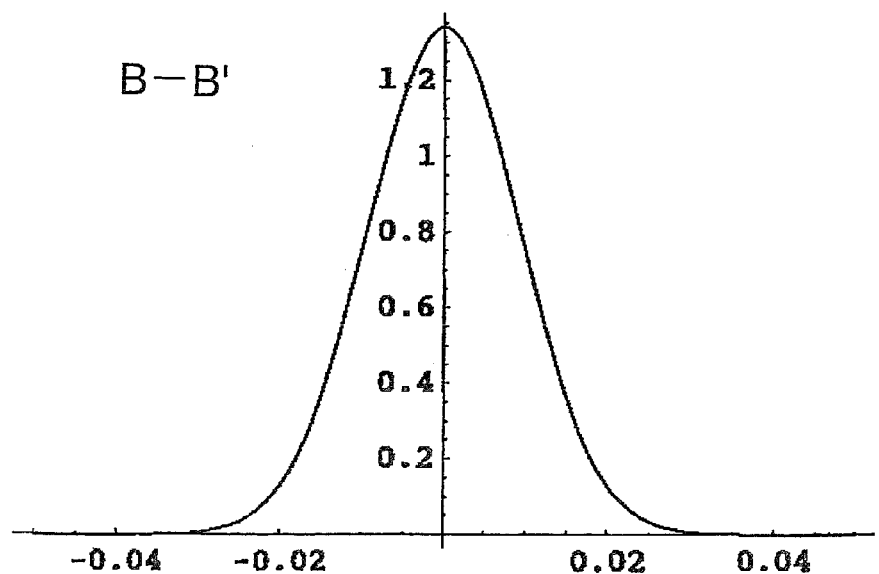
FIGS. 17A and 17B are diagrams showing the energy density distribution of a laser beam.
Figure 17B:
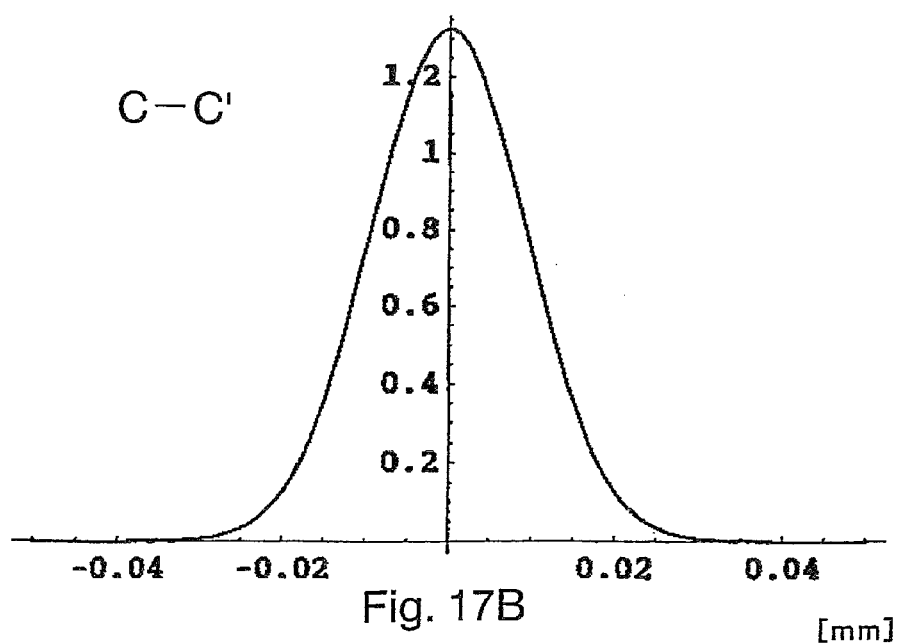

FIG. 17 shows an energy density distribution, determined by computation, on B-B' and C-C' in FIG. 16B. Note that FIG. 17 is with reference to the region satisfying an energy density of $1/e^2$ of a peak value of an uncombined laser beam. When the uncombined laser beam assumably has a length in minor axis direction of 37 μm and a length in major axis direction of 410 μm and a center-to-center distance of 192 μm, the energy densities on B-B' and C-C' have respective distributions as shown in FIG. 17A and FIG. 17B. Although the one on B-B' is somewhat smaller than the one on C-C', these can be considered to be substantially the same in magnitude. The combined laser beam, in a region satisfying an energy density of $1/e^2$ of a peak value of an uncombined laser beam, can be considered as linear in form.

Figure 18:
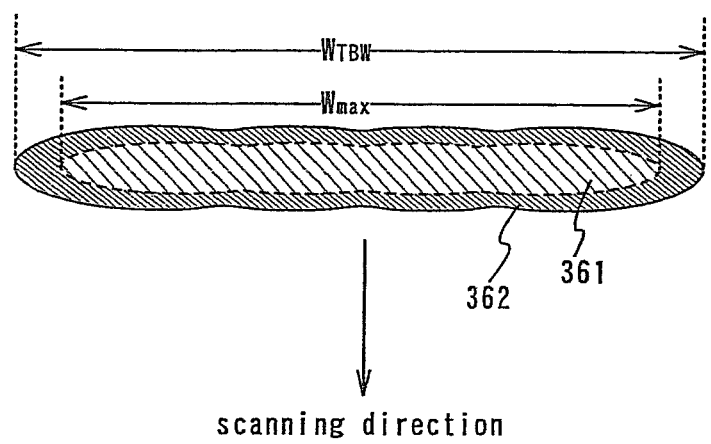
FIG. 18 is a diagram showing the energy density distribution of a laser beam.

FIG. 18A shows an energy distribution of a combined laser beam. The region shown at 361 is a region where energy density is to be determined uniform while the region shown at 362 is a region having a low energy density. In FIG. 18, it is assumed that the laser beam has a length in a center axis direction of $W_{TBW}$ while the region 361 having a uniform energy density has a length in a center axis direction of $W_{max}$. As $W_{TBW}$ increases greater as compared to $W_{max}$, the ratio of the region 362 uneven in energy density not to be used in crystallizing a semiconductor film increases relatively to the region 361 uniform in energy density to be used in crystallization. The semiconductor film irradiated only by the region 362 uneven in energy density has fine crystals, thus being not well in crystallinity. Consequently, there arises a necessity to define a layout of scanning route and insulating film depression-projection such that the region of semiconductor film to be made into an island is not superposed with only the region 362. This restriction increases furthermore as the ratio of region 362 to region 361 increases. Accordingly, it is effective to use a slit to prevent only the region 362 uneven in energy density from being irradiated to the semiconductor film formed on the insulating film depression part or projection part, in respect of decreasing the restriction occurring upon providing a layout of scanning route and insulating film depression-projection.

This embodiment can be implemented by combining with Embodiments 1 through 5.

Embodiment 7

This embodiment describes an optical system of laser irradiation apparatus used in the present invention, and the positional relation between a slit and the optical system.

Figure 19:
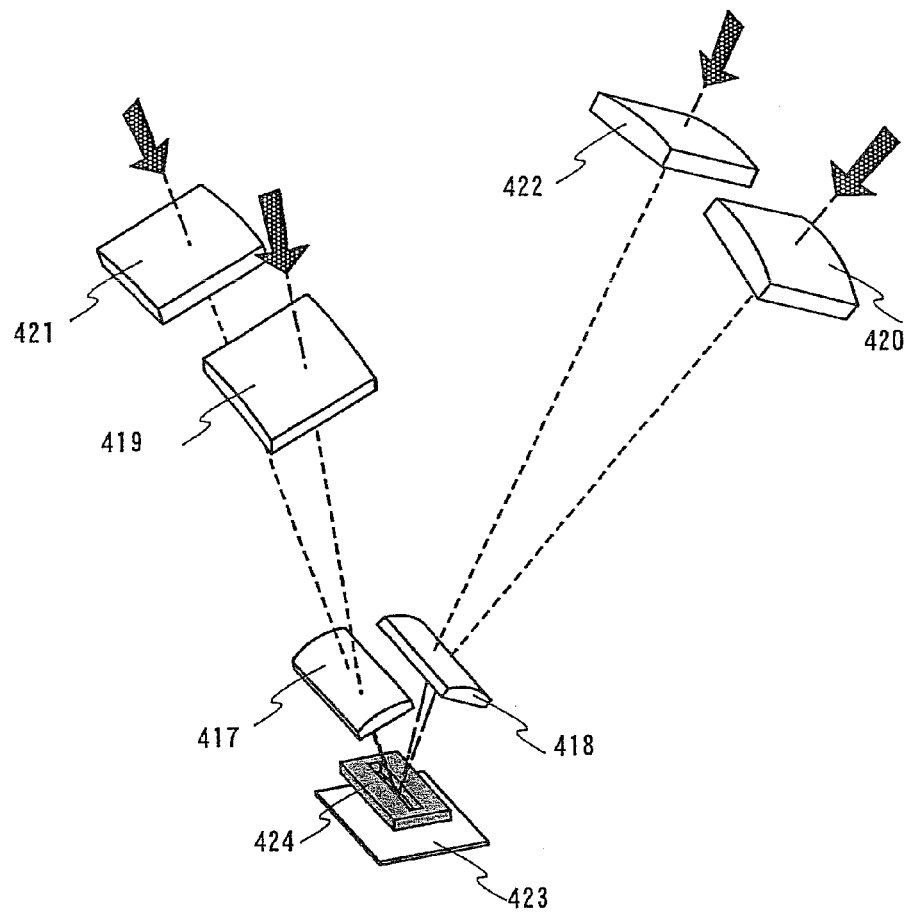
FIG. 19 is a diagram of an optical system.

FIG. 19 shows an optical system for synthesizing four laser beams to obtain one laser beam. The optical system shown in FIG. 19 has six cylindrical lenses 417 to 422. Four laser beams entering the optical system from the directions indicated by the arrows separately enter the four cylindrical lenses 419 to 422. Two laser beams shaped by the cylindrical lenses 419 and 421 reach the cylindrical lens 417, which modifies the shapes of the laser beams. The laser beams travel through a slit 424 to irradiate a processing object 423. On the other hand, two laser beams shaped by the cylindrical lenses 420 and 422 reach the cylindrical lens 418, which modifies the shapes of the laser beams. The laser beams travel through the slit 424 to irradiate the processing object 423.

The laser beams on the processing object 423 partially overlap one another for synthesization, thereby forming one laser beam.

The focal length and incident angle of each lens can be set at designer's discretion. However, the focal length of the cylindrical lenses 417 and 418 which are the closest to the processing object 423 is set shorter than the focal length of the cylindrical lenses 419 to 422. For example, the focal length of the cylindrical lenses 417 and 418 which are the closest to the processing object 423 is set to 20 mm whereas the focal length of the cylindrical lenses 419 to 422 is set to 150 mm. In this embodiment, the lenses are arranged such that laser beams enter the processing object 423 from the cylindrical lenses 417 and 418 at an incident angle of 25° and laser beams enter the cylindrical lenses 417 and 418 from the cylindrical lenses 419 to 422 at an incident angle of 10°. In order to avoid return light and irradiate uniformly, the incident angle at which laser light enters the substrate is kept at an angle larger than 0°, desirably, 5 to 30°.

In the example shown in FIG. 19, four laser beams are synthesized. In this case, four cylindrical lenses respectively associated with four laser oscillators and two cylindrical lenses associated with the four cylindrical lenses are provided. The number of laser beams synthesized is not limited to 4. It is sufficient if the number of laser beams synthesized is equal to or more than 2 and equal to or less than 8. When n (n=2, 4, 6, 8) laser beams are synthesized, n cylindrical lenses respectively associated with n laser oscillators and n/2 cylindrical lenses associated with the n cylindrical lenses are provided. When n (n=3, 5, 7) laser beams are synthesized, n cylindrical lenses respectively associated with n laser oscillators and (n+1)/2 cylindrical lenses associated with the n cylindrical lenses are provided.

When five or more laser beams are synthesized, the fifth and the following laser beams desirably irradiate a substrate from the opposite side of the substrate, taking into consideration where to place the optical system, interference, and the like. In this case, another slit is needed on the opposite side of the substrate. Also, the substrate has to be transmissive.

In order to prevent light from traveling back its light path (return light), the incident angle at which laser light enters the substrate is desirably kept at an angle larger than 0° and smaller than 90°.

A plane which is perpendicular to the irradiated face and which includes a shorter side of the rectangular shape of each beam before synthesization, or a longer side thereof, is defined as an incident plane. When the length of the shorter side or longer side included in the incident plane is given as W, and the thickness of a substrate which is transmissive of the laser light and which is set on the irradiated face is given as d, an incident angle θ of the laser light desirably satisfies θ≥ arctan (W/2d) to achieve uniform laser light irradiation. This has to be true in each laser light before synthesization. If the track of this laser light is not on the incident plane, the incident angle of the track projected onto the incident plane is deemed as θ. When laser light enters the substrate at this incident angle θ, interference between light reflected at the front side of the substrate and reflected light from the back side of the substrate can be avoided to give the substrate uniform laser beam irradiation. The premise of the above discussion is that the refractive index of the substrate is 1. In practice, the refractive index of the substrate is often around 1.5, and the angle calculated taken this fact into account is larger than the angle calculated in the above discussion. However, the energy of a beam spot is attenuated at its ends in the longitudinal direction and influence of interference is small in these portions. Therefore enough interference attenuation effect can be obtained with the value calculated in the above discussion. The above-mentioned inequality of θ does not apply to those substrates that are transmissive to a laser beam.

An optical system of laser irradiation apparatus used in the present invention can have other structures than the one shown in this embodiment.

This embodiment can be combined with Embodiments 1 through 6.

Embodiment 8

The laser light having a laser beam in an elliptic form has an energy density distribution perpendicular to a scanning direction following the Gaussian distribution. Consequently, the ratio of a low energy density region to the entire is higher as compared to the laser light having a rectangular or linear laser beam. Accordingly, in the invention, the laser beam of laser light is desirably rectangular or linear comparatively uniform in energy density distribution.

The representative gas laser, for obtaining a rectangular or linear laser beam, is an excimer laser while the representative solid laser is a slab laser. This embodiment explains a slab laser.

FIG. 20A shows an example of a laser oscillator structure of a slab type. The slab-type laser oscillator of FIG. 20A has a rod 7500, a reflection mirror 7501, an output mirror 7502 and a cylindrical lens 7503.

In case an excitation light is irradiated to the rod 7500, laser light travels through a zigzag optical path and emits toward the reflection mirror 7501 or emission mirror 7502. The laser light emitted toward the reflection mirror 7501 is reflected thereon and again enters the rod 7500, then emitting toward the emission mirror 7502. The rod 7500 is of a slab type using a plate-like slab medium to form a comparatively long rectangular or linear laser beam upon emission. The emitted laser light, in the cylindrical lens 7503, is formed smaller in its laser beam form and emitted at the laser oscillator.

Figure 20B:
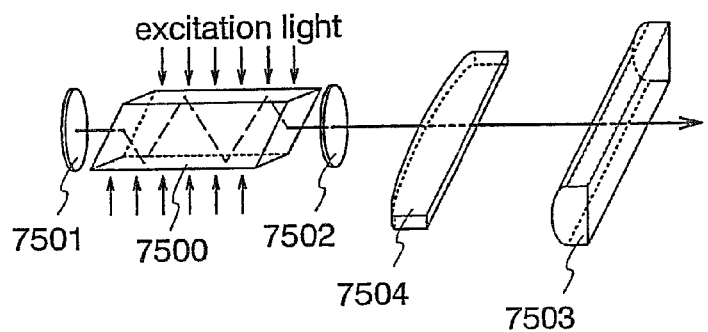

FIG. 20B shows a slab-type laser oscillator structure different from that showed in FIG. 20A. In FIG. 20B, a cylindrical lens 7504 is added to the laser oscillator of FIG. 20A to control a laser beam length by the cylindrical lens 7504.

Incidentally, with a coherent length of 10 cm or longer, preferably 1 m or longer, the laser beam can be reduced in form furthermore.

In order to prevent the rod 7500 from excessively rising in temperature, temperature control means may be provided, e.g. circulating a cooling water.

Figure 20C:
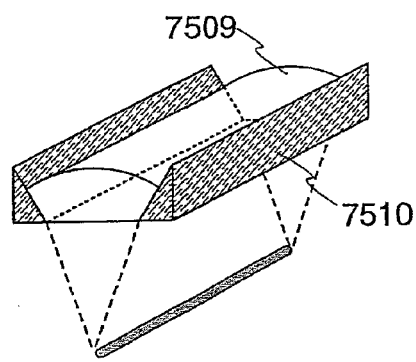

FIG. 20C shows an embodiment of a cylindrical lens form. 7509 is a cylindrical lens of this embodiment fixed by a holder 7510. The cylindrical lens 7509 has a form that a cylindrical surface and a rectangular flat surface are opposed to each other, wherein the two generating lines of the cylindrical surface and the two sides of the opposed rectangle are all in parallel with one another. The two surfaces, formed by the two lines of cylindrical surface and the parallel two lines, intersect with the rectangular flat surface at an angle greater than 0 degree and smaller than 90 degrees. In this manner, the two surfaces formed with the two parallel sides intersect with the rectangular flat surface at an angle of smaller than 90 degrees, whereby the focal length can be shortened as compared to that at 90 degrees or greater. This can further reduce the form of laser beam and approximate it to a linear form.

This embodiment can be implemented by combining with Embodiments 1 through 7.

Embodiment 9

This embodiment explains a relationship between a center-to-center distance of laser beams and an energy density when laser beams are superposed one over another.

Figure 21:
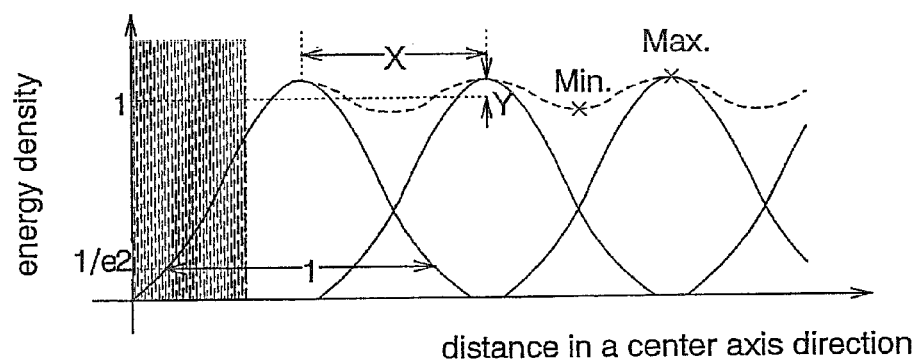
FIG. 21 is a diagram showing the energy density distribution in the central axis direction of laser beams overlapped.

FIG. 21 shows an energy density distribution of each laser beam in a center axis direction by the solid line and an energy density distribution of a combined laser beam by the dotted line. The energy density value of a laser beam in a center axis direction of a laser beam generally follows the Gaussian distribution.

Figure 22:
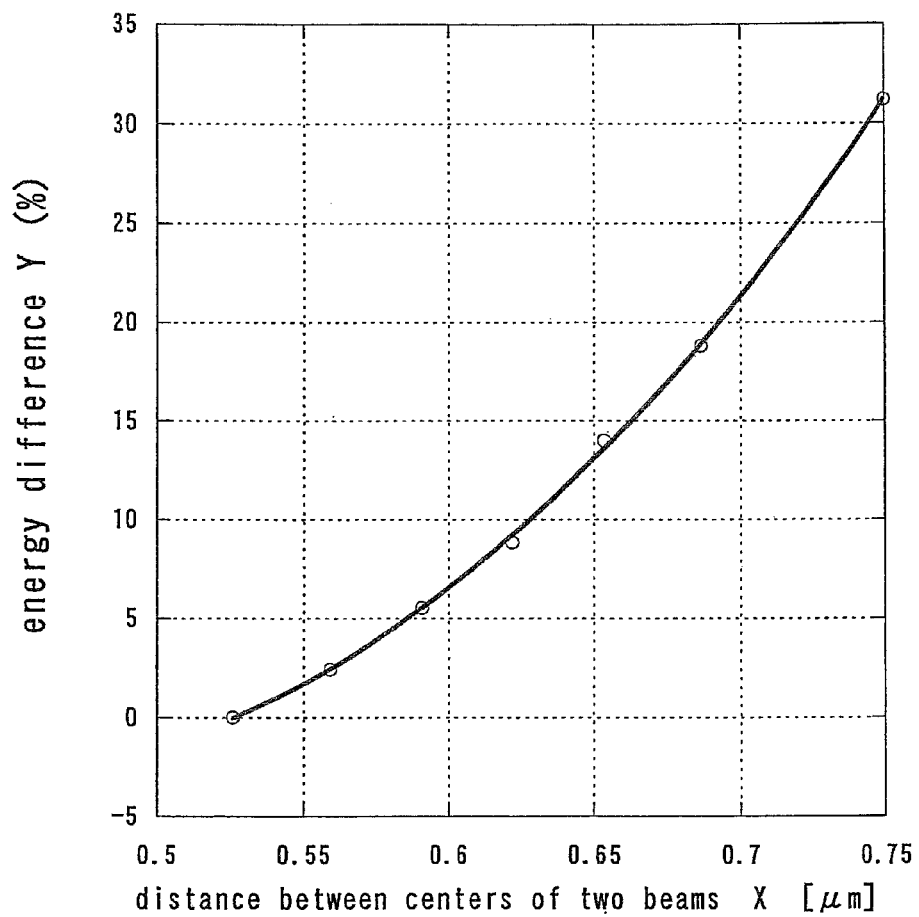
FIG. 22 is a diagram showing the energy difference in relation to the distance between the centers of laser beams.

It is assumed that, the uncombined laser beam has a peak-to-peak distance X when a distance in a center axis direction is taken as 1 that is satisfying an energy density equal to or greater than $1/e^2$ of a peak value. Meanwhile, in a combined laser beam, the increase amount of peak value is assumably taken as Y with respect to an average value of a peak value and valley value of after combination. FIG. 22 shows a relationship between X and Y determined on simulation. Note that Y in FIG. 22 is expressed by percentage.

In FIG. 22, an energy difference Y is expressed by an approximate expression as given in the following Equation 1.

$$Y = 60 - 293X + 340X^2 \quad \text{[Equation 1]}$$

(X: assumed to be greater one of two solutions)

According to Equation 1, it can be seen that X=0.584 may be provided when obtaining an energy difference of approximately 5% for example. Incidentally, although ideally Y=0, there is practically a difficulty in realizing it. There is a need for the designer to appropriately set an allowable range of energy difference Y. Although ideally Y=0, it makes the beam spot length short. Consequently, X is preferably determined considering a balance with throughput.

Figure 23:
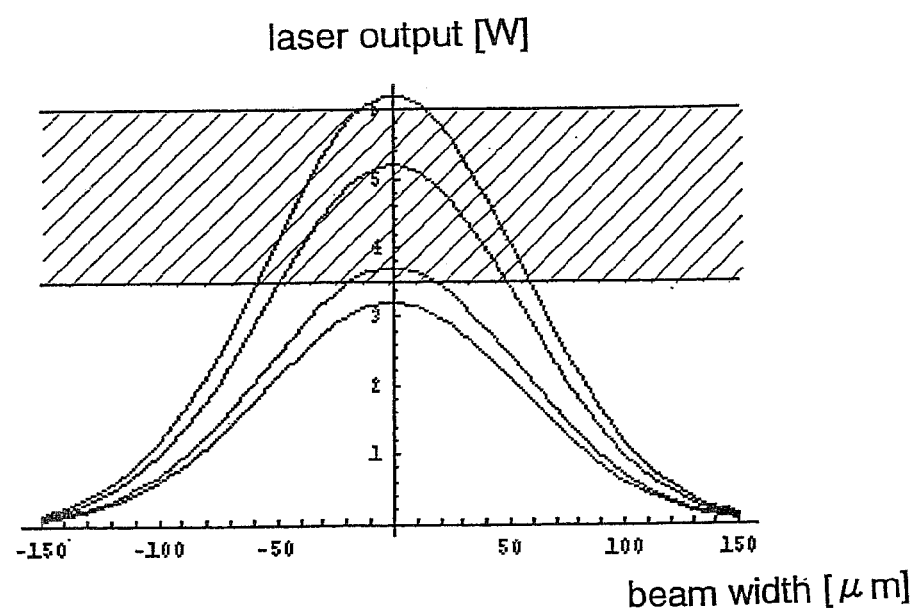
FIG. 23 is a diagram showing the output energy distribution in the central axis direction of a laser beam.

Explanation is now made on an allowable range of Y. FIG. 23 shows an output (W) distribution of $YVO_4$ laser with respect to a beam width in a center axis direction in the case the laser beam has an elliptic form. The hatched region is an output energy range required to obtain favorable crystallinity. It can be seen that the output energy of combined laser light is satisfactorily within a range of 3.5-6 W.

When the output energy maximum and minimum values of a beam spot after combination are fallen, to a full limit, within the output energy range required to obtain favorable crystallinity, the energy difference Y for favorable crystallinity assumes to be the maximum. Accordingly, in the case of FIG. 23, the energy difference Y is ±26.3%. It can be seen that favorable crystallinity is to be obtained provided that the energy difference Y falls within the foregoing range.

Incidentally, the output energy range for favorable crystallinity varies depending upon to what extent crystallinity is to be determined favorable. Further, because output energy distribution changes depending on a laser beam form, the allowable range of energy difference Y is not necessarily limited to the foregoing value. The designer is required to appropriately define an output energy range required to obtain favorable crystallinity and set an allowable range of energy difference Y from an output energy distribution of a laser to be used.

This embodiment can be implemented in combination with Embodiments 1-8.

Embodiment 10

The present invention can be applied to various semiconductor devices. A mode of a display panel manufactured in accordance with Embodiments 1 through 9 will be described with reference to FIGS. 24 and 25.

Figure 24:
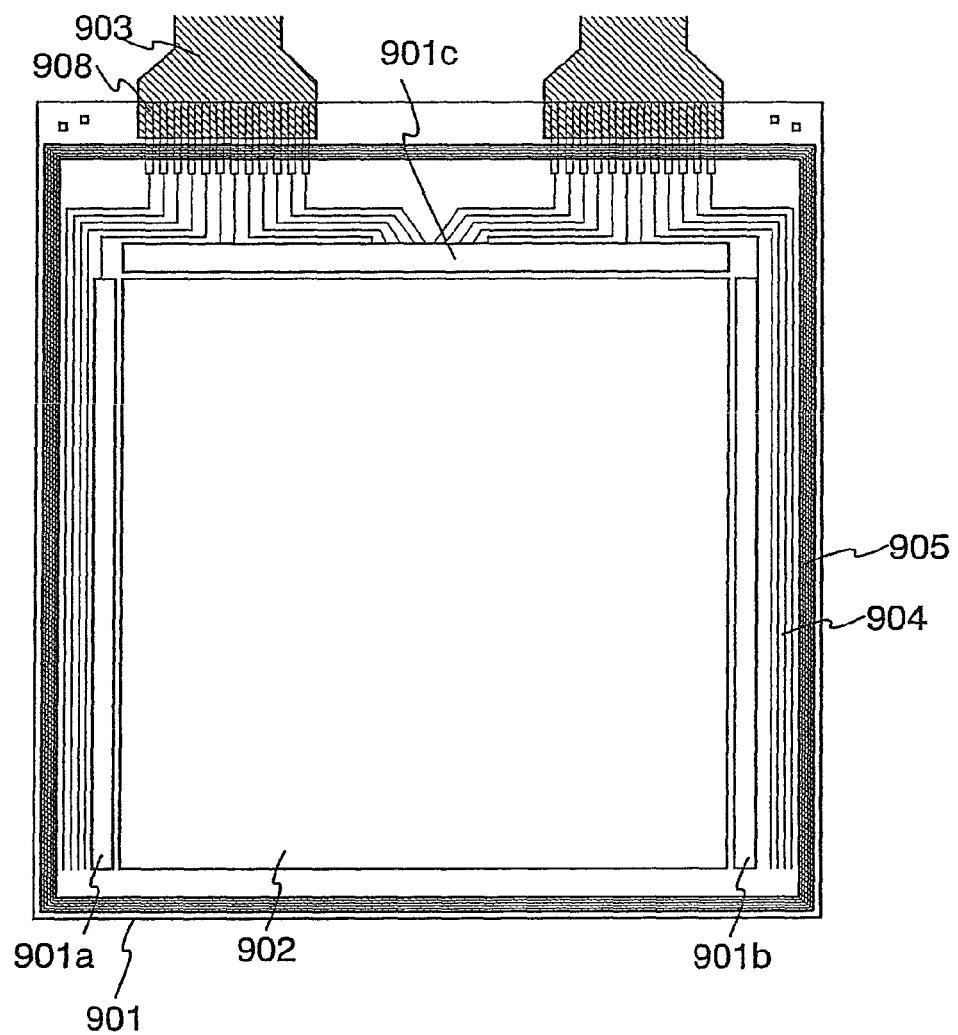
FIG. 24 is a diagram showing the structure of a light emitting device that is an example of a semiconductor device of the present invention.

In FIG. 24, a substrate 901 is provided with a pixel portion 902, gate signal side driving circuits 901a and 901b, a data signal side driving circuit 901c, an input/output terminal portion 908, and a wire or group of wires 904. A shield pattern 905 may partially overlap the gate signal side driving circuits 901a and 901b and the data signal side driving circuit 901c, as well as the wire or group of wires 904 for connecting the driving circuits with the input/output terminal portion 908. In this way, the area of the frame region (the region surrounding the pixel portion) of the display panel can be reduced. An FPC 903 is fixed to the input/output terminal portion 908.

The present invention can be used in active elements constituting the pixel portion 902, the gate signal side driving circuits 901a and 901b, and the data signal side driving circuit 901c.

Figure 25:
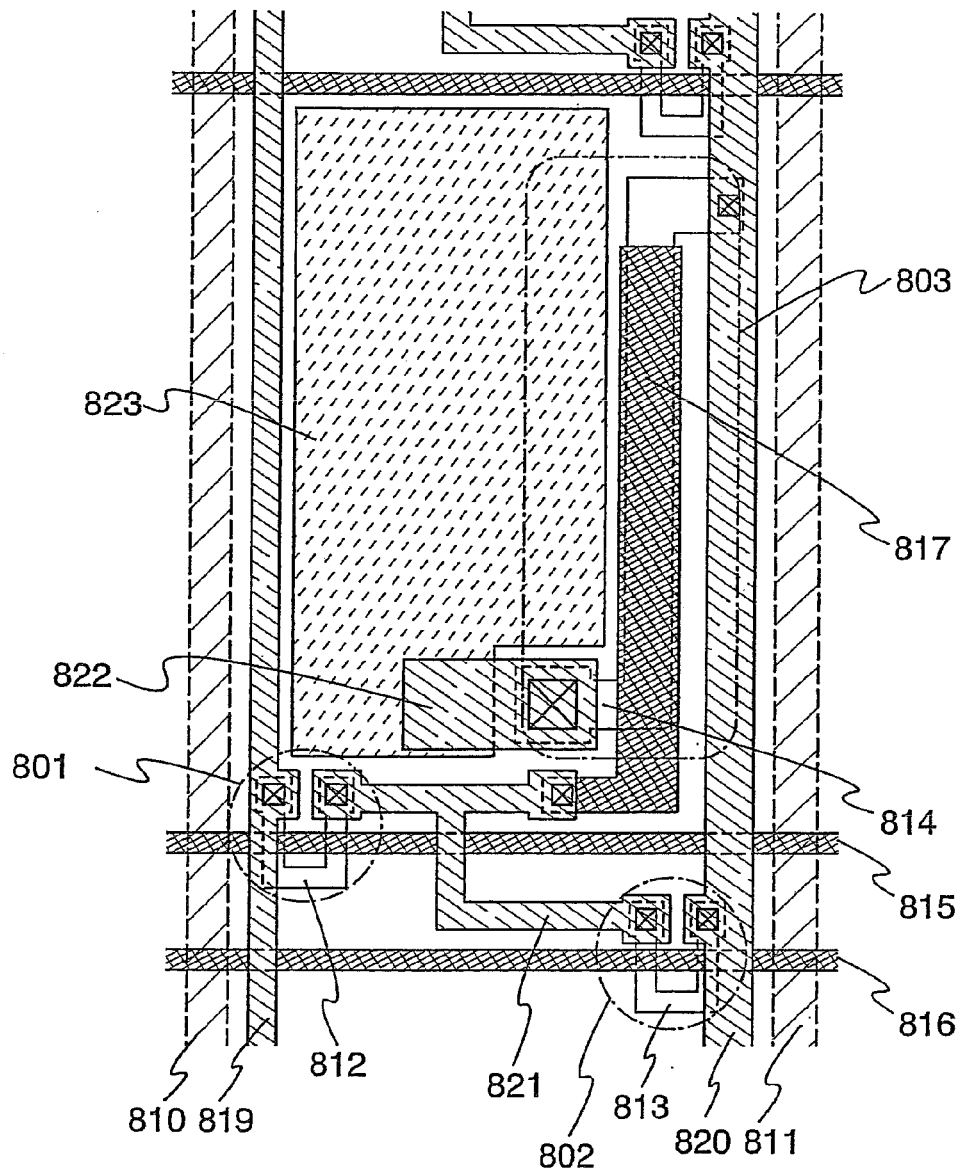
FIG. 25 is a diagram showing a pixel structure in a light emitting device that is an example of a semiconductor device of the present invention.

FIG. 25 shows an example of the structure of one pixel in the pixel portion 902 shown in FIG. 24. The pixel has TFTs 801 to 803, which are a switching TFT, a reset TFT, and a driving TFT, respectively, for controlling a light emitting element or liquid crystal element of the pixel.

These TFTs have active layers 812 to 814. Each of the active layers is placed between one edge of a depression portion 810 or 811 of the insulating film formed below the active layers and the midpoint between the one edge and the other edge of the depression portion. Gate wires 815 to 817 are formed in a layer above the active layers 812 to 814. A passivation film and a planarization film are formed on the gate wires. A data line 819, a power supply line 820, other various wires 821 and 822, and a pixel electrode 823 are formed on the passivation film and the planarization film.

This embodiment uses for the TFTs islands formed on the bottom of depression portions. Instead, islands formed on the top of projection portions may be used for the TFTs.

This embodiment can be combined freely with Embodiments 1 through 9.

Embodiment 11

The semiconductor device equipped with the TFT formed by the present invention can be applied to various electronic apparatuses. Examples of the electronic apparatuses are portable information terminals (electronic books, mobile computers, cellular phones, or the like), video cameras, digital cameras, personal computers, TV receivers, cellular phones, projection display apparatuses, or the like. Specific examples of these electronic apparatuses are shown in FIGS. 26A to 26G.

Figure 26A:
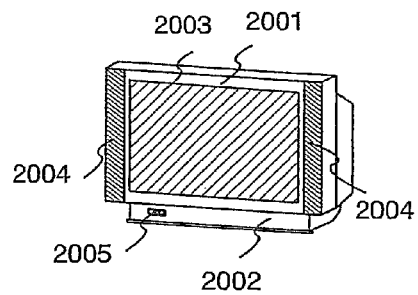
FIGS. 26A to 26H are diagrams of electronic equipment using a semiconductor device of the present invention.

FIG. 26A shows a display apparatus, which is composed of a case 2001, a support base 2002, a display unit 2003, speaker units 2004, a video input terminal 2005, etc. The display apparatus of the present invention is completed by using the semiconductor device of the present invention to the display unit 2003. Since the light emitting device having the light emitting element is self-luminous, the device does not need back light and can make a thinner display unit than liquid crystal display devices. The display device refers to all display devices for displaying information, including ones for personal computers, for TV broadcasting reception, and for advertisement.

Figure 26B:
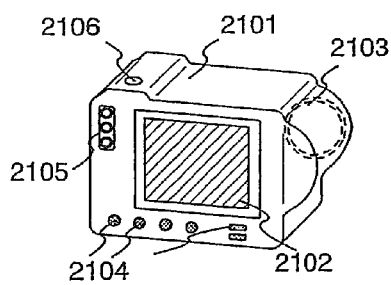

FIG. 26B shows a digital still camera, which is composed of a main body 2101, a display unit 2102, an image receiving unit 2103, operation keys 2104, an external connection port 2105, a shutter 2106, etc. The digital still camera of the present invention is completed by using the semiconductor device of the present invention to the display unit 2102.

Figure 26C:
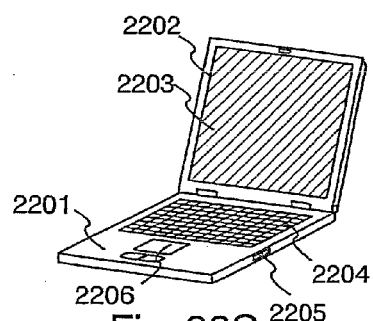

FIG. 26C shows a notebook personal computer, which is composed of a main body 2201, a case 2202, a display unit 2203, a keyboard 2204, an external connection port 2205, a pointing mouse 2206, etc. The notebook personal computer of the present invention is completed by using the semiconductor device of the present invention to the display unit 2203.

Figure 26D:
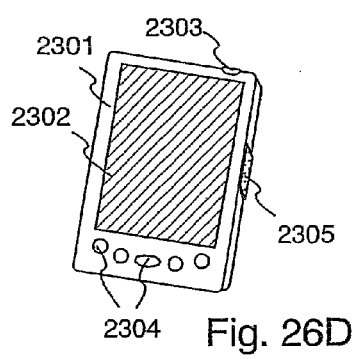

FIG. 26D shows a mobile computer, which is composed of a main body 2301, a display unit 2302, a switch 2303, operation keys 2304, an infrared port 2305, etc. The light emitting device manufactured in accordance with the present invention can be applied to the display unit 2302. The mobile computer of the present invention is completed by using the semiconductor device of the present invention to the display unit 2302.

Figure 26E:
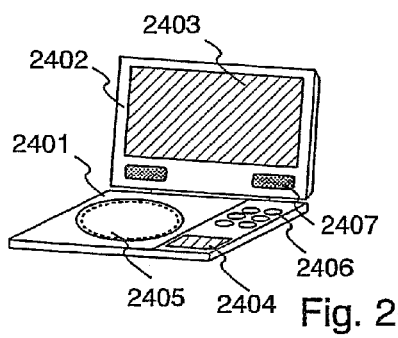

FIG. 26E shows a portable image reproducing device equipped with a recording medium (a DVD player, to be specific). The device is composed of a main body 2401, a case 2402, a display unit A 2403, a display unit B 2404, a recording medium (DVD or the like) reading unit 2405, operation keys 2406, speaker units 2407, etc. The display unit A 2403 mainly displays image information whereas the display unit B 2404 mainly displays text information. The light emitting device manufactured in accordance with the present invention can be applied to the display units A 2403 and B 2404. The portable image reproducing device of the present invention is completed by using the semiconductor device of the present invention to the display units A 2403 and B 2404.

Figure 26F:
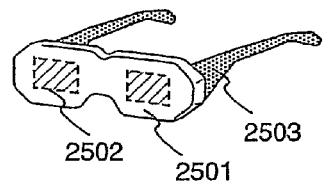

FIG. 26F shows a goggle type display (head mounted display), which is composed of a main body 2501, display units 2502, and arm units 2503. The goggle type display of the present invention is completed by using the semiconductor device of the present invention to the display units 2502.

Figure 26G:
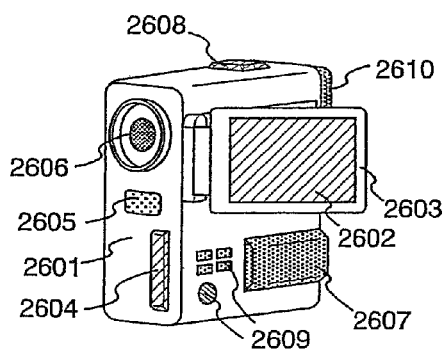

FIG. 26G shows a video camera, which is composed of a main body 2601, a display unit 2602, a case 2603, an external connection port 2604, a remote control receiving unit 2605, an image receiving unit 2606, a battery 2607, an audio input unit 2608, operation keys 2609, eye piece portion 2610 etc. The video camera of the present invention is completed by using the semiconductor device of the present invention to the display unit 2602.

Figure 26H:
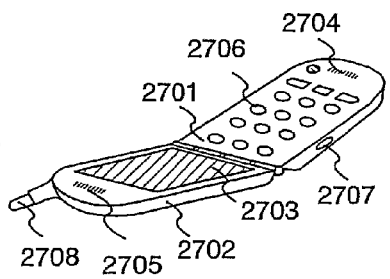

FIG. 26H shows a cellular phone, which is composed of a main body 2701, a case 2702, a display unit 2703, an audio input unit 2704, an audio output unit 2705, operation keys 2706, an external connection port 2707, an antenna 2708, etc. The light emitting device manufactured in accordance with the present invention can be applied to the display unit 2703.

If the display unit 2703 displays white letters on black background, the cellular phone consumes less power. The cellular phone of the present invention is completed by using the semiconductor device of the present invention to the display unit 2703.

As described above, the application range of the present invention is so wide that it is applicable to electric apparatuses of any field. This embodiment can be operated by combining with any structure shown in Embodiments 1 through 10.

Embodiment 12

Figure 27:
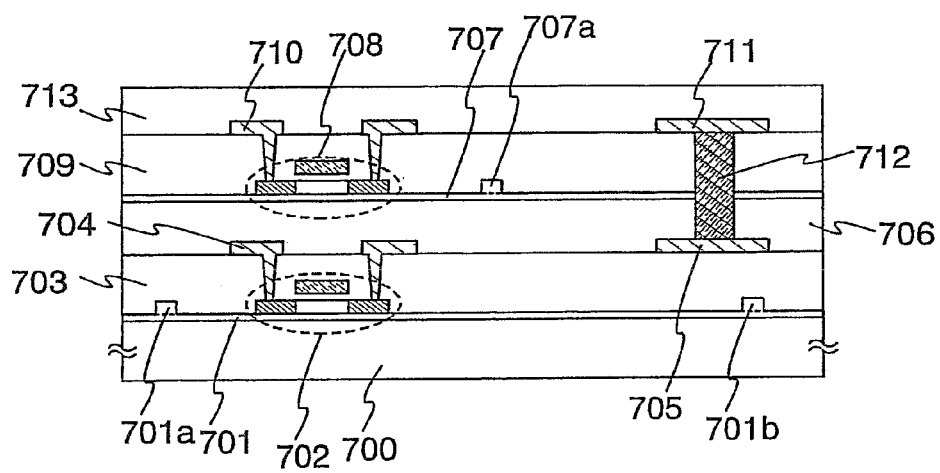
FIG. 27 is a sectional view of TFTs forming a stack structure.

This embodiment describes the structure of a semiconductor device of the present invention. FIG. 27 is a sectional view of a semiconductor device of this embodiment.

A first insulating film 701 having projection portions 701*a* and 701*b* is formed on a substrate 700. A first TFT 702 is formed on the first insulating film 701. An island of the first TFT 702 is formed on the first insulating film 701 between one edge of a depression portion and the midpoint between the one edge and the other edge of the depression portion. This depression portion is created by the projection portions 701*a* and 701*b*.

A first interlayer insulating film 703 is formed to cover the first TFT 702. On the first interlayer insulating film 703, a first connection wire 705 and wire 704 are formed. The wire 704 is electrically connected to the first TFT 702.

A second interlayer insulating film 706 is formed to cover the wire 704 and the first connection wire 705. The second interlayer insulating film 706 is an inorganic insulating film. If the top face of the second interlayer insulating film is polished by chemical mechanical polishing (CMP), a second insulating film formed later can have more level surface and the crystallinity of a semiconductor film to be formed on the second insulating film and crystallized by laser light can be enhanced.

A second insulating film 707 is formed on the second interlayer insulating film 706. The second insulating film 707 has a projection portion 707*a*. A second TFT 708 is formed on the second insulating film 707. An island of the second TFT 708 is formed on the second insulating film 707 between one edge of a depression portion and the midpoint between the one edge and the other edge (not shown in the drawing) of the depression portion. This depression portion is created by the projection portion 707*a*.

A third interlayer insulating film 709 is formed to cover the second TFT 708. On the third interlayer insulating film 709, a second connection wire 711 and a wire 710 are formed. The wire 710 is electrically connected to the second TFT 708. An embedded wire (plug) 712 is formed between the first connection wire 705 and the second connection wire 711 by Damascene process or the like.

A fourth interlayer insulating film 713 is formed to cover the wire 710 and the second connection wire 711.

In this embodiment, the first TFT 702 and the second TFT 708 overlap each other with an interlayer insulating film sandwiched therebetween to form a so-called stack structure. The stack structure TFTs of this embodiment can be used to build a CPU using an LSI, memory devices (e.g., SRAM) of various logic circuits, a counter circuit, a frequency divider circuit, etc.

This embodiment uses for the TFTs islands formed on the bottom of depression portions. Instead, islands formed on the top of projection portions may be used for the TFTs.

This embodiment can be combined freely with Embodiments 1 through 11.

Embodiment 13

This embodiment describes the energy density distribution of a linear laser beam that is obtained by synthesizing plural elliptical laser beams.

Figure 28:
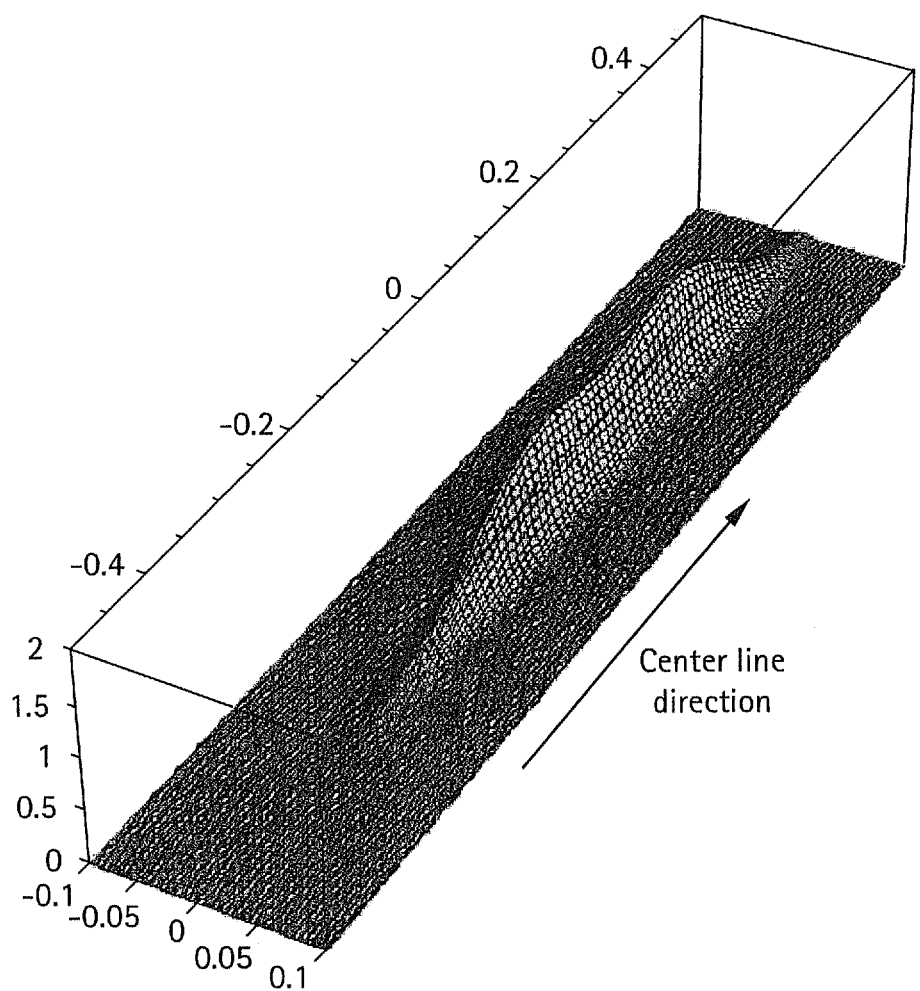
FIG. 28 is a diagram showing the energy density distribution of a laser beam that is obtained by synthesizing two laser beams.

FIG. 28 shows the energy density distribution in $1/e^2$ width of a laser beam obtained by overlapping two elliptical laser beams each measuring 400 µm in major axis and 40 µm in minor axis. Measurements in the graph are all in mm (unit). The distance between centers of adjacent beams is 0.255 mm.

Figure 29:
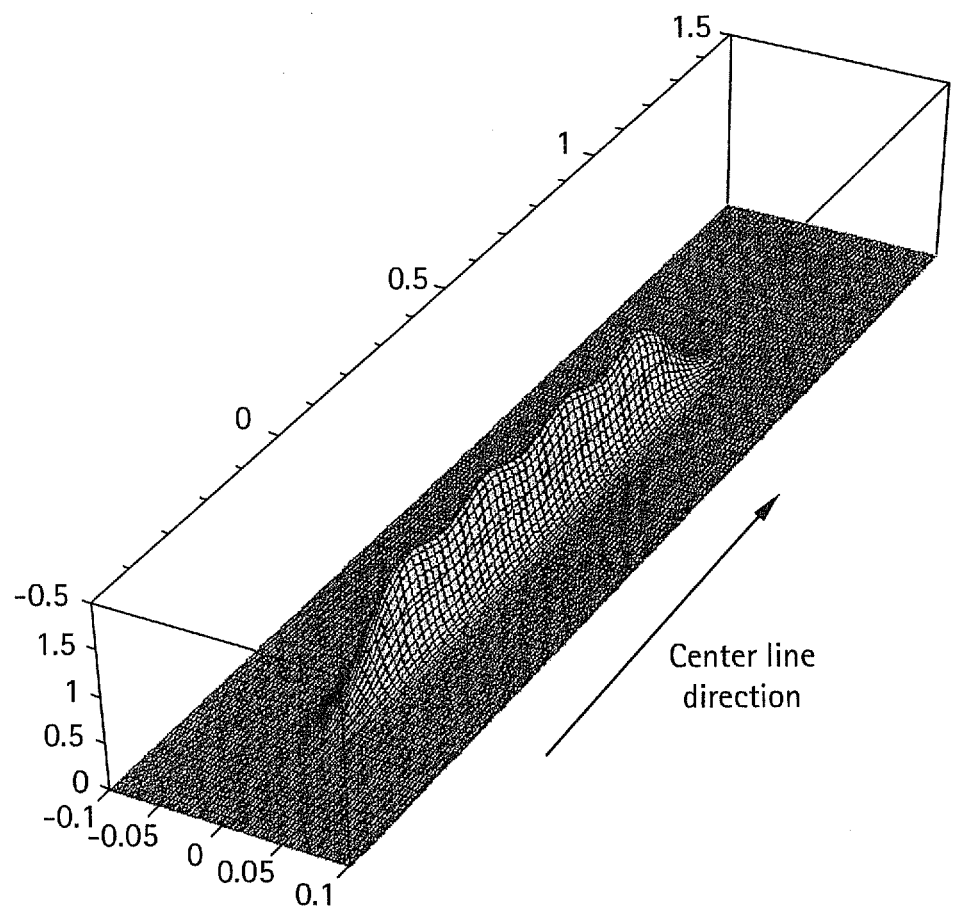
FIG. 29 is a diagram showing the energy density distribution of a laser beam that is obtained by synthesizing four laser beams.

In addition, FIG. 29 shows the energy density distribution in $1/e^2$ width of a laser beam obtained by overlapping two elliptical laser beams each measuring 400 µm in major axis and 40 µm in minor axis. Measurements in the graph are all in mm (unit). The distance between centers of adjacent beams is 0.255 mm.

Figure 30:
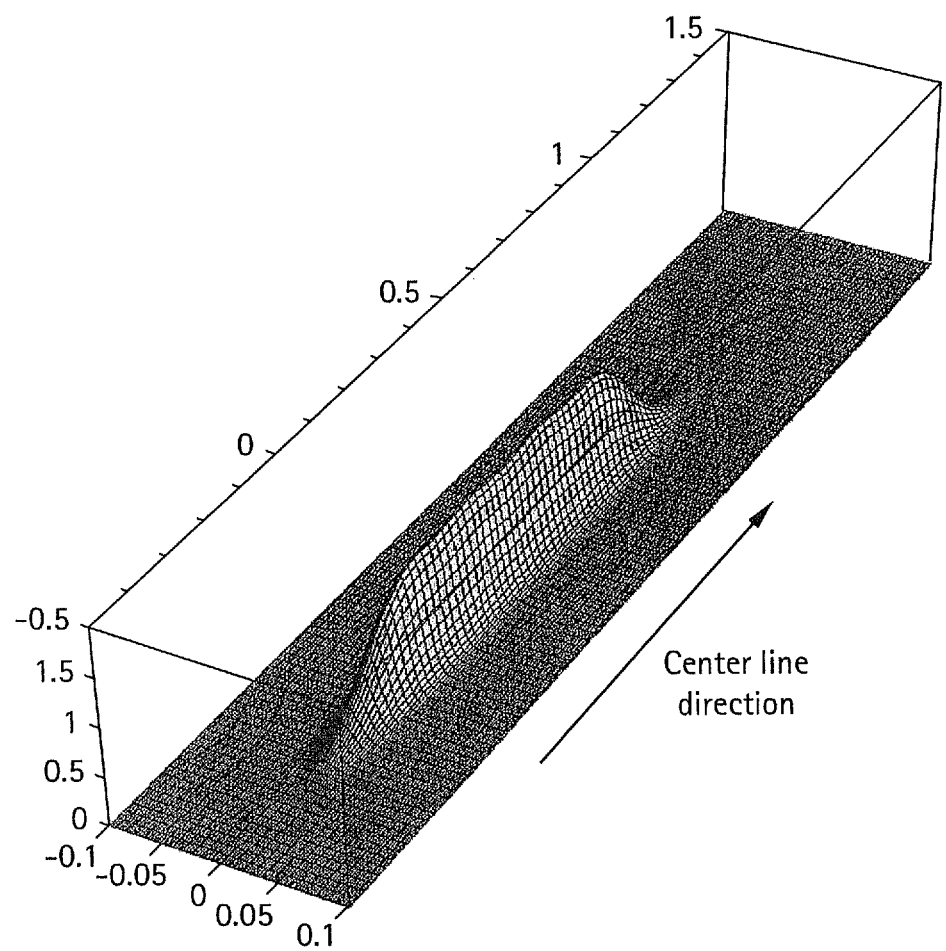
FIG. 30 is a diagram showing the energy density distribution of a laser beam that is obtained by synthesizing four laser beams.

In addition, FIG. 30 shows the energy density distribution in $1/e^2$ width of a laser beam obtained by overlapping four elliptical laser beams each measuring 400 µm in major axis and 40 µm in minor axis. Measurements in the graph are all in mm (unit). The distance between centers of adjacent beams is 0.215 mm.

In an elliptical laser beam, the energy density distribution in the center line direction matches Gaussian distribution. On the other hand, a laser beam obtained by overlapping plural elliptical laser beams has an energy density distribution in the center line direction which forms a waveform above a certain level as shown in FIGS. 28, 29, and 30. Unlike an elliptical laser beam, it can be said that the energy density distribution in the center line direction of a laser beam obtained by synthesizing elliptical laser beams is relatively uniform and linear.

The use of such laser beam having a linear energy density distribution in the present invention makes it possible to form an island that has uniform crystallinity.

This embodiment can be combined freely with Embodiments 1 through 12.

Embodiment 14

This embodiment gives a description on the concentration of oxygen, nitrogen, carbon, and boron taken into a semiconductor film irradiated with continuous wave laser light.

First, an amorphous silicon film is formed to a thickness of 1500 Å on an insulating film that is formed of silicon oxynitride. A nickel acetate solution is applied to the amorphous silicon film and the film is heated at 500 to 650° C. Continuous wave laser light is then used to crystallize the film and obtain a crystalline silicon film (poly-Si). The laser light irradiation is conducted in the air in a clean room. A thin oxide film is naturally formed (natural oxide film) on the surface of the crystalline silicon film. Then an amorphous silicon film is formed to cover the crystalline silicon film and the natural oxide film.

In this state, secondary ion mass spectroscopy (SIMS) is performed on the film. The atomic percentage profiles of oxygen, nitrogen, carbon, and boron are shown in FIGS. 31 to 34, respectively.

Figure 31:
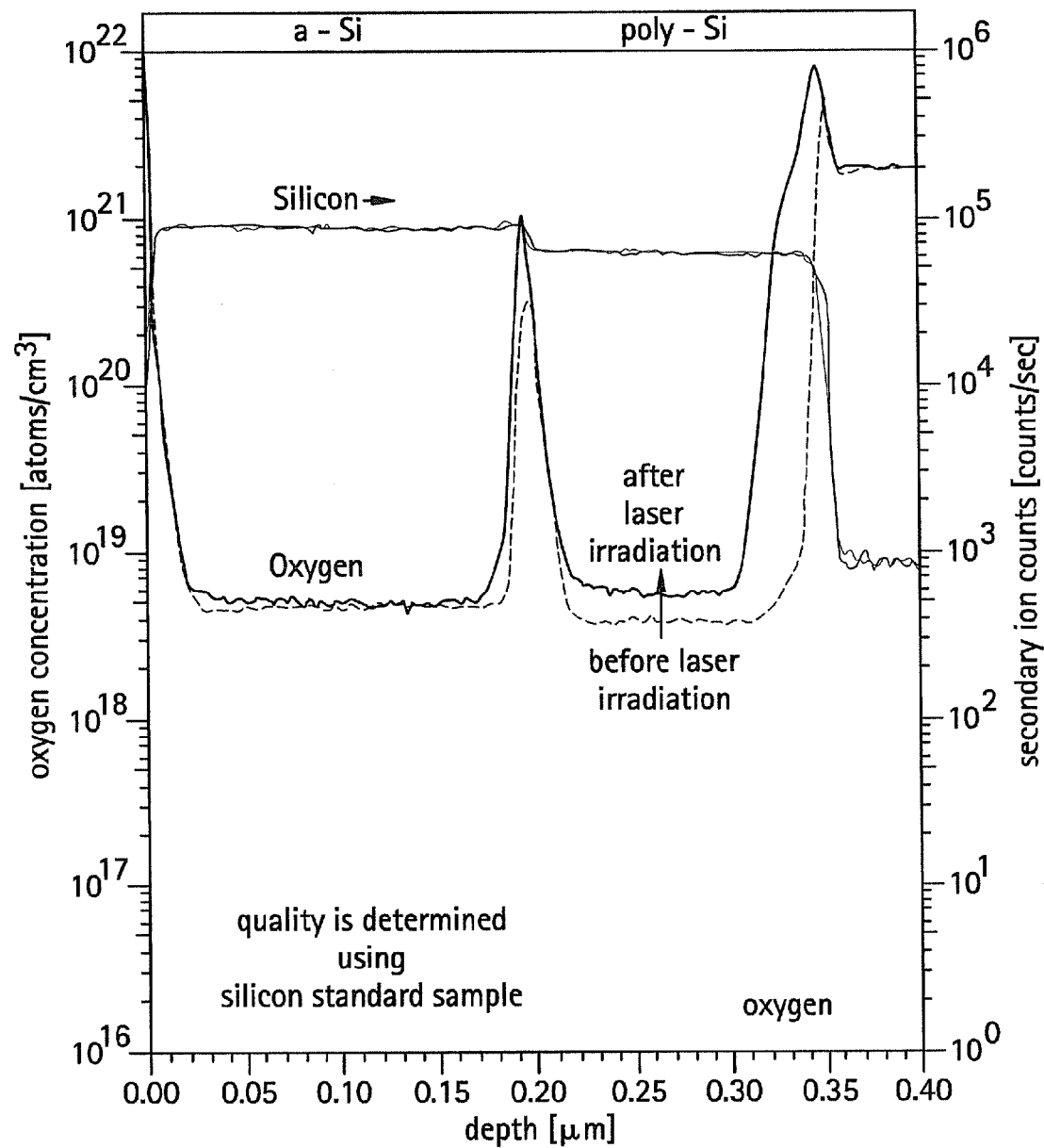
FIG. 31 shows the concentration profile of oxygen in a silicon film crystallized by laser light.

The oxygen concentration profile in the crystalline or amorphous silicon film is measured by SIMS and the results are shown in FIG. 31. The axis of ordinate shows the atomic percentage of oxygen and the axis of abscissa shows the depth from the sample surface. The solid line indicates the oxygen concentration of when laser light irradiation process is carried out, and the dashed line indicates the oxygen concentration of when laser light irradiation process is not carried out. The graph also shows the ionic strength of silicon with the axis of abscissa indicating the depth from the sample surface. The oxygen concentration after laser light irradiation is $2\times10^{19}$ atoms/cm$^3$ or lower. As FIG. 31 shows, the oxygen concentration in the silicon film is increased by laser light irradiation.

Figure 32:
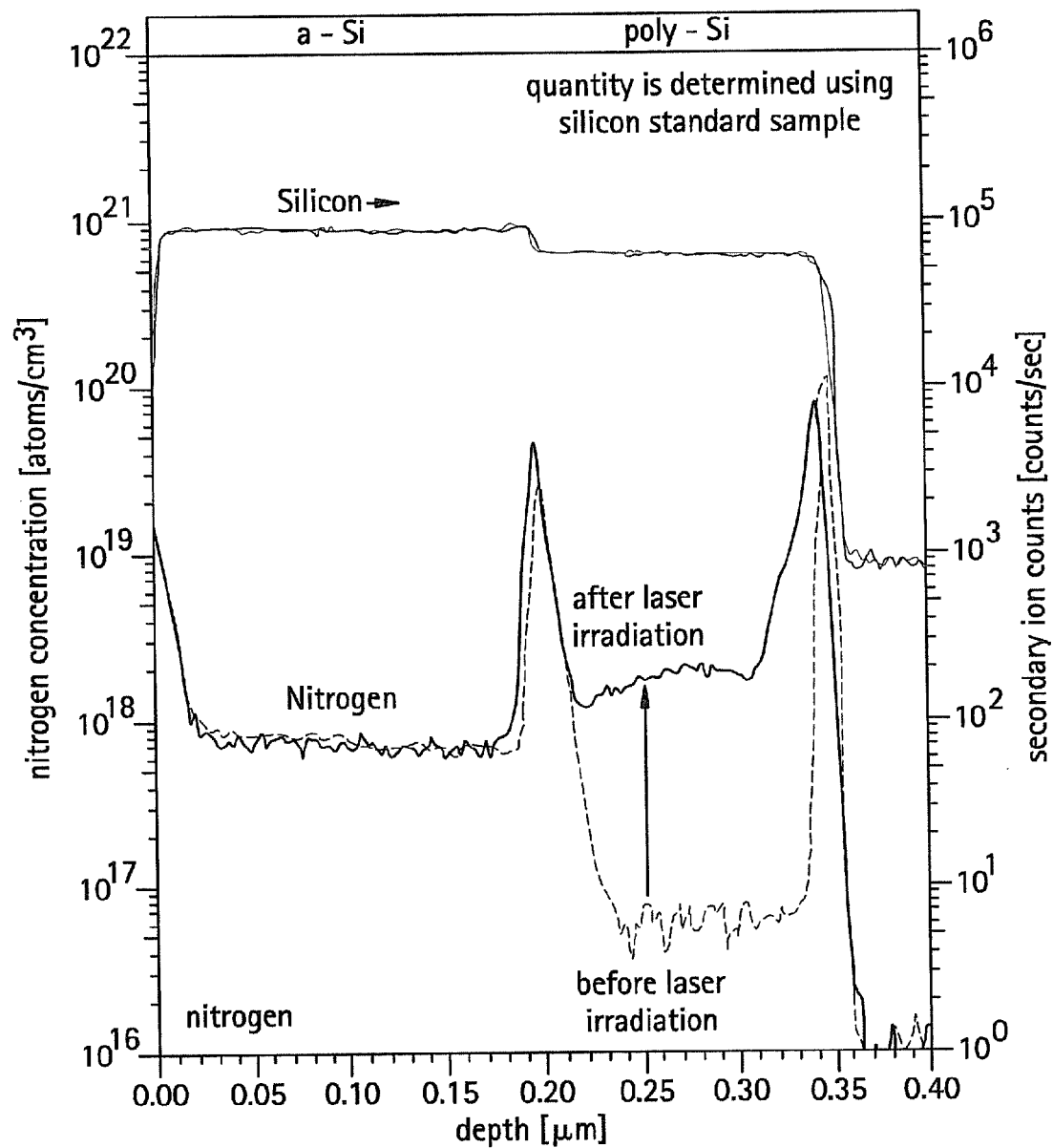
FIG. 32 shows the concentration profile of nitrogen in a silicon film crystallized by laser light.

The nitrogen concentration profile in the crystalline or amorphous silicon film is measured by SIMS and the results are shown in FIG. 32. The axis of ordinate shows the atomic percentage of nitrogen and the axis of abscissa shows the depth from the sample surface. The solid line indicates the nitrogen concentration of when laser light irradiation process is carried out, and the dashed line indicates the nitrogen concentration of when laser light irradiation process is not carried out. The graph also shows the ionic strength of silicon with the axis of abscissa indicating the depth from the sample surface. The nitrogen concentration after laser light irradiation is $1\times10^{19}$ atoms/cm$^3$ or lower. As FIG. 32 shows, the nitrogen concentration in the silicon film is increased by laser light irradiation.

Figure 33:
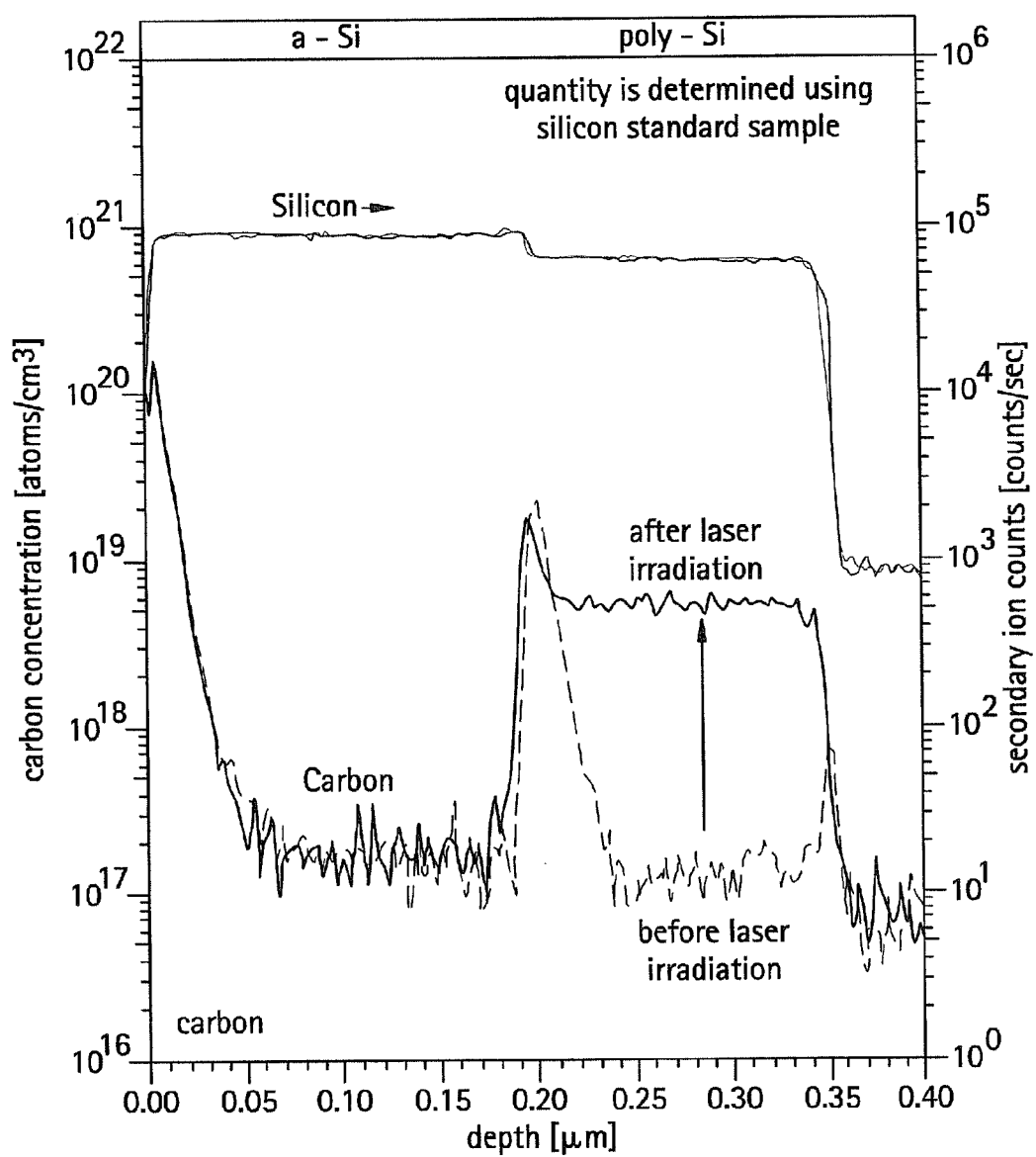
FIG. 33 shows the concentration profile of carbon in a silicon film crystallized by laser light.

The carbon concentration profile in the crystalline or amorphous silicon film is measured by SIMS and the results are shown in FIG. 33. The axis of ordinate shows the atomic percentage of carbon and the axis of abscissa shows the depth from the sample surface. The solid line indicates the carbon concentration of when laser light irradiation process is carried out, and the dashed line indicates the carbon concentration of when laser light irradiation process is not carried out. The graph also shows the ionic strength of silicon with the axis of abscissa indicating the depth from the sample surface. The carbon concentration after laser light irradiation is $5\times10^{18}$ atoms/cm$^3$ or lower. As FIG. 33 shows, the carbon concentration in the silicon film is increased by laser light irradiation.

Figure 34:
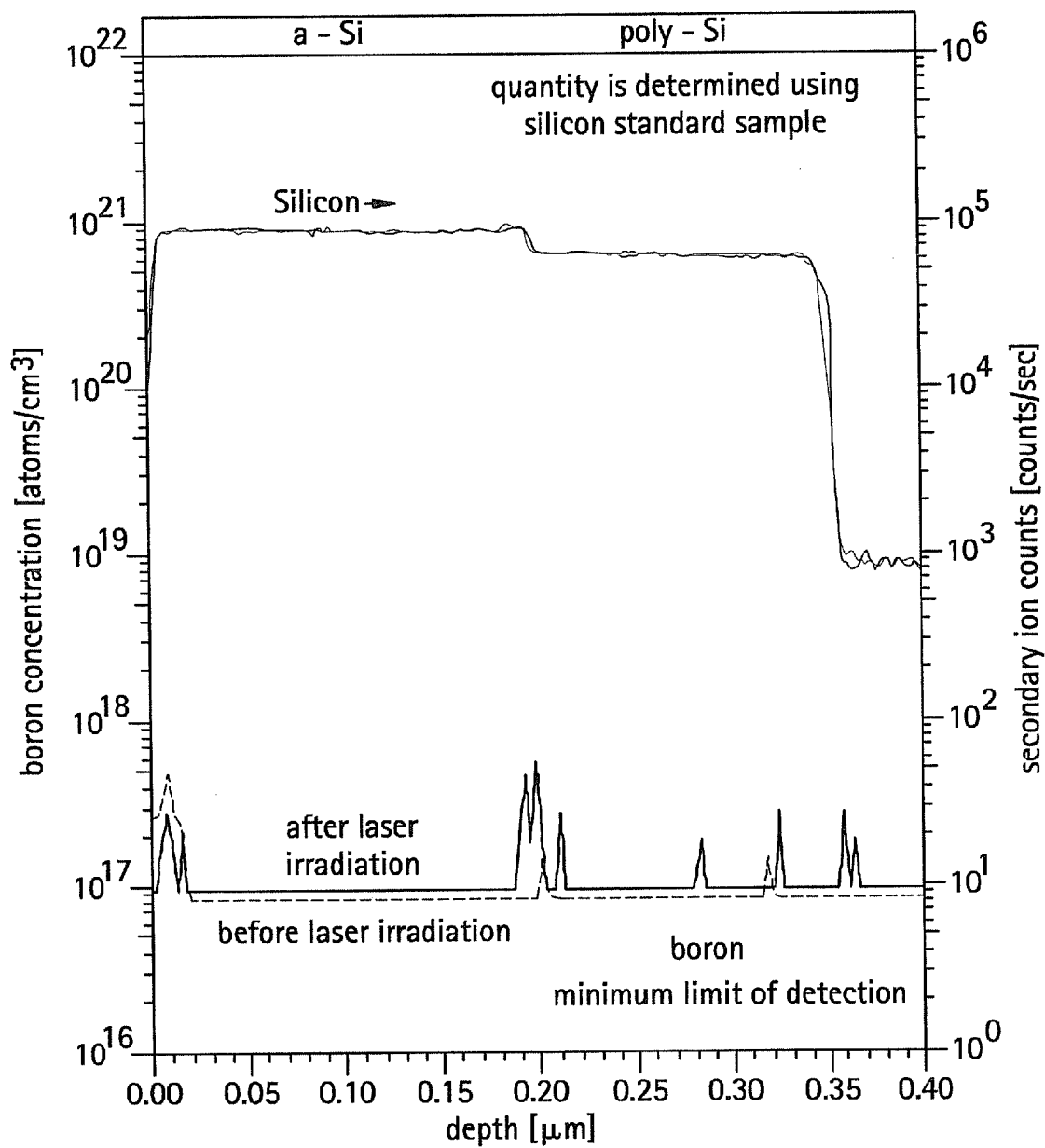
FIG. 34 shows the concentration profile of boron in a silicon film crystallized by laser light.

The boron concentration profile in the crystalline or amorphous silicon film is measured by SIMS and the results are shown in FIG. 34. The axis of ordinate shows the atomic percentage of boron and the axis of abscissa shows the depth from the sample surface. The solid line indicates the boron concentration of when laser light irradiation process is carried out, and the dashed line indicates the boron concentration of when laser light irradiation process is not carried out. The graph also shows the ionic strength of silicon with the axis of abscissa indicating the depth from the sample surface. In FIG. 34, it seems that the boron concentration in the silicon film is slightly increased by laser light irradiation. The boron concentration is below the lowest level detectable by SIMS before and after laser irradiation anyway and the boron content in the film is very minute.

Embodiment 15

This embodiment describes the shape of an insulating film and a relation between it and the thickness of a semiconductor film formed on the insulating film.

Figure 35A:
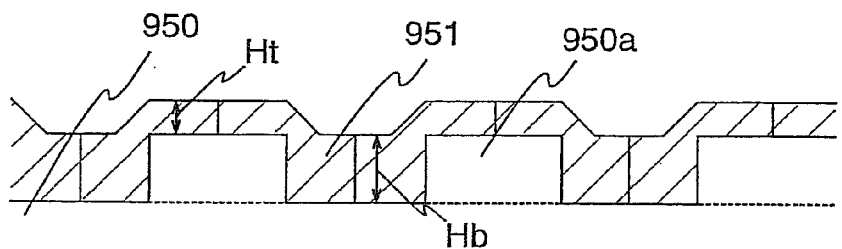
FIGS. 35A to 35C are sectional views of an insulating film that has depression and projection portions and a semiconductor film that is formed on the insulating film.

FIG. 35A shows an insulating film 950 having projection portions 950a and a semiconductor film 951 that is formed on the insulating film. The semiconductor film 951 shown here has already been crystallized by laser light.

As shown in FIG. 35A, a thickness Ht of the semiconductor film 951 on the projection portions 950a is smaller than a thickness Hb of the semiconductor film 951 on a depression portion between the projection portions 950a. This is supposedly because the semiconductor film temporarily melted by laser light irradiation moves into the depression portion. Therefore it is considered that the surface of the semiconductor film 951 is leveled to a certain degree through laser light irradiation.

Figure 35B:
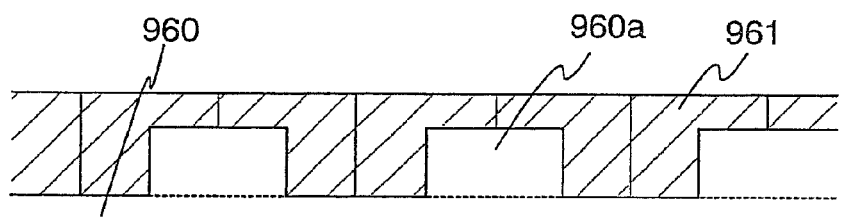

FIG. 35B shows an insulating film 960 having projection portions 960a and a semiconductor film 961 which is formed on the insulating film and which has a flat surface. In contrast to FIG. 35A where the semiconductor film 951 has depression and projection on its surface, the surface of the semiconductor film in FIG. 35B is leveled by laser light irradiation.

Figure 35C:
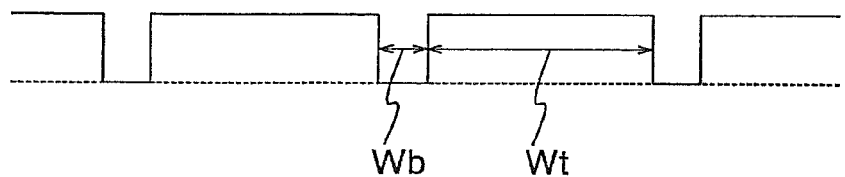

FIG. 35C is a sectional view of an insulating film in which a width Wt of a projection portion is larger than a width Wb of a depression portion in the direction perpendicular to the laser light scanning direction. When a portion of a semiconductor film that is on a projection portion and has excellent crystallinity is used as an active layer of a TFT, the width Wt of a projection portion is preferably larger than the width Wb of a depression portion as shown in FIG. 35C because this reduces restrictions in layout of an island.

This embodiment can be combined freely with Embodiments 1 through 14.

In the present invention, a semiconductor film crystallized by laser light is patterned to remove a portion of the film around the midpoint between edges of a depression portion or projection portion. The remaining portion between one edge of a depression portion or projection portion and the midpoint between the one edge and the other edge of the depression portion or projection portion, which has fewer grain boundaries and therefore has excellent crystallinity, is effectively used as an active layer of a TFT. This makes it possible to avoid forming a grain boundary in a channel formation region of a TFT, thereby preventing grain boundaries from lowering the mobility of the TFT greatly, from lowering ON current, and from increasing OFF current. How far from an edge of a depression portion or projection portion is to be removed by patterning can be decided at designer's discretion.

The present invention runs laser light so as to obtain at least the minimum degree of crystallization of a portion that has to be crystallized, instead of irradiating the entire semiconductor film with laser light. This structure saves time for laser irradiation of portions that are removed by patterning after crystallization of the semiconductor film and thereby greatly shortens the processing time per substrate.

The crystallinity of a semiconductor film can be enhanced more efficiently when plural laser beams are overlapped to supplement one another's low energy density portions than when using a single laser beam.

The position of a grain boundary in a semiconductor film formed on an insulating film may be controlled by forming depression and projection portions on a substrate itself through etching, instead of forming depression and projection portions on the insulating film.

What is claimed is:
1. A method for manufacturing a semiconductor device comprising:
forming an insulating film over an insulating substrate;
selectively etching the insulating film to form a plurality of projection portions, wherein each of the plurality of projection portions has a rectangular or stripe pattern;
forming a semiconductor film so as to cover the plurality of projection portions;
irradiating the semiconductor film with a laser light; and
removing a portion of the semiconductor film so that a plurality of semiconductor islands is formed between each of the plurality of projection portions after the irradiating step.

2. A method for manufacturing a semiconductor device according to claim 1, wherein the irradiating step is conducted according to a defined scanning route in advance.

3. A method for manufacturing a semiconductor device according to claim 1, wherein the laser light is a continuous wave laser light.

4. A method for manufacturing a semiconductor device according to claim 1, wherein the laser light is a second harmonic.

5. A method for manufacturing a semiconductor device according to claim 1, wherein the semiconductor device is one selected from the group consisting of a display apparatus, a camera, a computer, a goggle type display, and a phone.

6. A method for manufacturing a semiconductor device comprising:
   forming a first insulating film over an insulating substrate;
   forming a second insulating film over the first insulating film;
   selectively etching the second insulating film to form a plurality of projection portions, wherein each of the plurality of projection portions has a rectangular or stripe pattern;
   forming a semiconductor film so as to cover the plurality of projection portions;
   irradiating the semiconductor film with a laser light; and
   removing a portion of the semiconductor film so that a plurality of semiconductor islands is formed between each of the plurality of projection portions after the irradiating step.

7. A method for manufacturing a semiconductor device according to claim 6, wherein the irradiating step is conducted according to a defined scanning route in advance.

8. A method for manufacturing a semiconductor device according to claim 6, wherein the first insulating film comprises silicon oxide nitride, and the second insulating film comprises silicon oxide.

9. A method for manufacturing a semiconductor device according to claim 6, wherein the laser light is a continuous wave laser light.

10. A method for manufacturing a semiconductor device according to claim 6, wherein the laser light is a second harmonic.

11. A method for manufacturing a semiconductor device according to claim 6, wherein the semiconductor device is one selected from the group consisting of a display apparatus, a camera, a computer, a goggle type display, and a phone.

* * * * *